(12) United States Patent
Nakaya

(10) Patent No.: US 11,211,539 B2
(45) Date of Patent: Dec. 28, 2021

(54) THERMOELECTRIC CONVERSION ELEMENT AND THERMOELECTRIC CONVERSION MODULE

(71) Applicant: Hiroaki Nakaya, Osakasayama (JP)

(72) Inventor: Hiroaki Nakaya, Osakasayama (JP)

( * ) Notice: Subject to any disclaimer, the term of this patent is extended or adjusted under 35 U.S.C. 154(b) by 0 days.

(21) Appl. No.: 15/757,229

(22) PCT Filed: Aug. 30, 2016

(86) PCT No.: PCT/JP2016/075355
§ 371 (c)(1),
(2) Date: Mar. 2, 2018

(87) PCT Pub. No.: WO2017/038831
PCT Pub. Date: Mar. 9, 2017

(65) Prior Publication Data
US 2018/0254400 A1 Sep. 6, 2018

(30) Foreign Application Priority Data
Sep. 4, 2015 (JP) .............................. JP2015-174755

(51) Int. Cl.
*H01L 35/22* (2006.01)
*H01L 35/24* (2006.01)
(Continued)

(52) U.S. Cl.
CPC ............ *H01L 35/22* (2013.01); *C01B 32/168* (2017.08); *C01B 32/21* (2017.08); *H01L 35/16* (2013.01); *H01L 35/24* (2013.01); *H01L 35/32* (2013.01)

(58) Field of Classification Search
CPC ................................................ H01L 35/00–34
(Continued)

(56) References Cited

U.S. PATENT DOCUMENTS 3,061,656 A   10/1962   Chappell
2011/0100406 A1   5/2011   Danenberg
(Continued)

FOREIGN PATENT DOCUMENTS

CN   1162370 C   8/2004
CN   102106010 A   6/2011
(Continued)

OTHER PUBLICATIONS

The Engineering ToolBox. "Thermal Conductivity of Common Materials and Gases." https://www.engineeringtoolbox.com/thermal-conductivity-d_429.html. Accessed online Mar. 21, 2019. (Year: 2019).*

(Continued)

*Primary Examiner* — Tamir Ayad
(74) *Attorney, Agent, or Firm* — Stites & Harbison, PLLC; Terry L. Wright; Jeffrey A. Haeberlin

(57) ABSTRACT

The present invention provides thermoelectric conversion elements and thermoelectric conversion modules which are possible to effectively use oxide materials having high Seebeck coefficient, and excellently improve their outputs. The present invention provides thermoelectric conversion elements which comprise at least a charge transport layer, thermoelectric conversion material layers and electrodes, wherein the charge transport layer comprises a graphite treated to dope charge-donating materials so that the graphite has an n-type semiconductor property, or a graphite treated to dope charge-accepting materials so that the graphite has a p-type semiconductor property, and provides thermoelectric conversion modules using the thermoelectric conversion elements.

6 Claims, 7 Drawing Sheets

(51) Int. Cl.
  *H01L 35/32* (2006.01)
  *H01L 35/16* (2006.01)
  *C01B 32/168* (2017.01)
  *C01B 32/21* (2017.01)

(58) Field of Classification Search
  USPC .................................................. 136/200–242
  See application file for complete search history.

(56) References Cited

U.S. PATENT DOCUMENTS

| | | | |
|---|---|---|---|
| 2012/0042922 | A1 | 2/2012 | Kondo et al. |
| 2013/0167897 | A1 | 7/2013 | Choi et al. |
| 2014/0054550 | A1* | 2/2014 | Hong .................. H01L 29/1606 257/29 |
| 2014/0174495 | A1* | 6/2014 | Nakaya .................. H01L 35/32 136/204 |
| 2014/0230868 | A1 | 8/2014 | Ryu et al. |

FOREIGN PATENT DOCUMENTS

| | | |
|---|---|---|
| JP | 2014-225534 A | 12/2014 |
| JP | 2015507846 A | 3/2015 |
| WO | 2010-146657 A1 | 12/2010 |
| WO | 2014-133029 A1 | 9/2014 |
| WO | 2015-098574 A1 | 7/2015 |

OTHER PUBLICATIONS

IP Australia, Examination Report issued in corresponding Application No. 2016316164, dated Sep. 14, 2018.
Japan Patent Office, International Search Report issued in corresponding Application No. PCT/JP2016/075355, dated Oct. 16, 2016.
Canadian Intellectual Property Office, Office Action issued in corresponding Application No. 2,996,898, dated Oct. 25, 2018.
IP Australia, Examination Report No. 2 issued in corresponding Application No. 2016316164, dated Aug. 6, 2019.
Matsumoto, R., et al. "Thermoelectric Properties and Performance of n-Type and p-Type Graphite Intercalation Compounds," 2015, Journal of Electronic Materials, vol. 44, No. 1, pp. 399-406.

* cited by examiner

FIG.6
(1) Perspective view
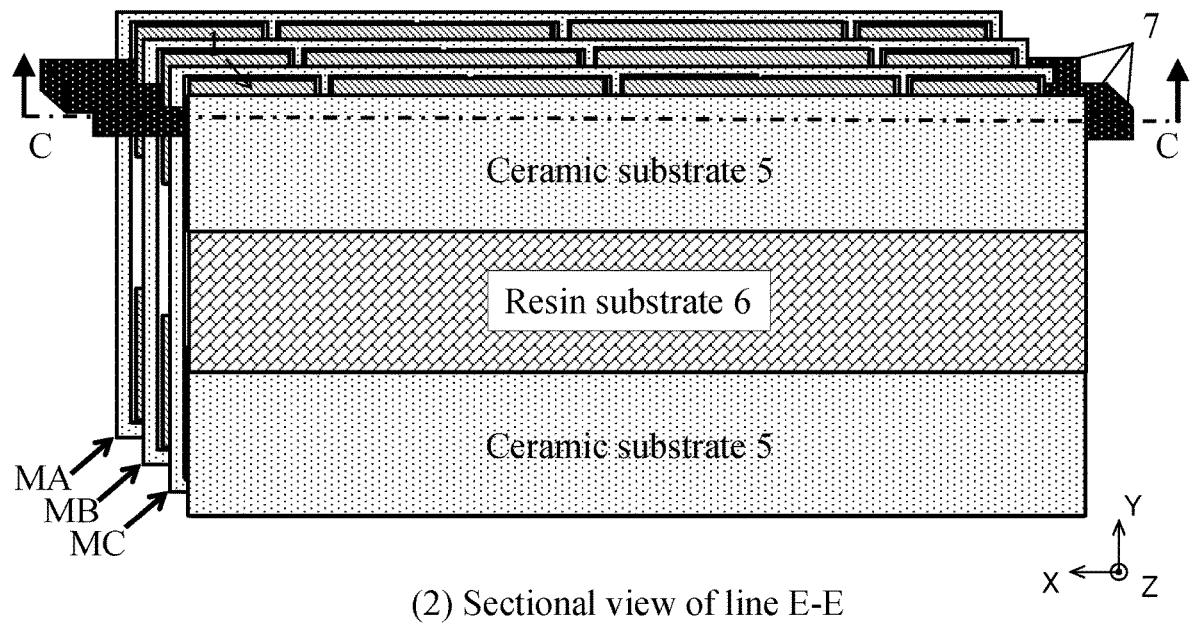
(2) Sectional view of line E-E
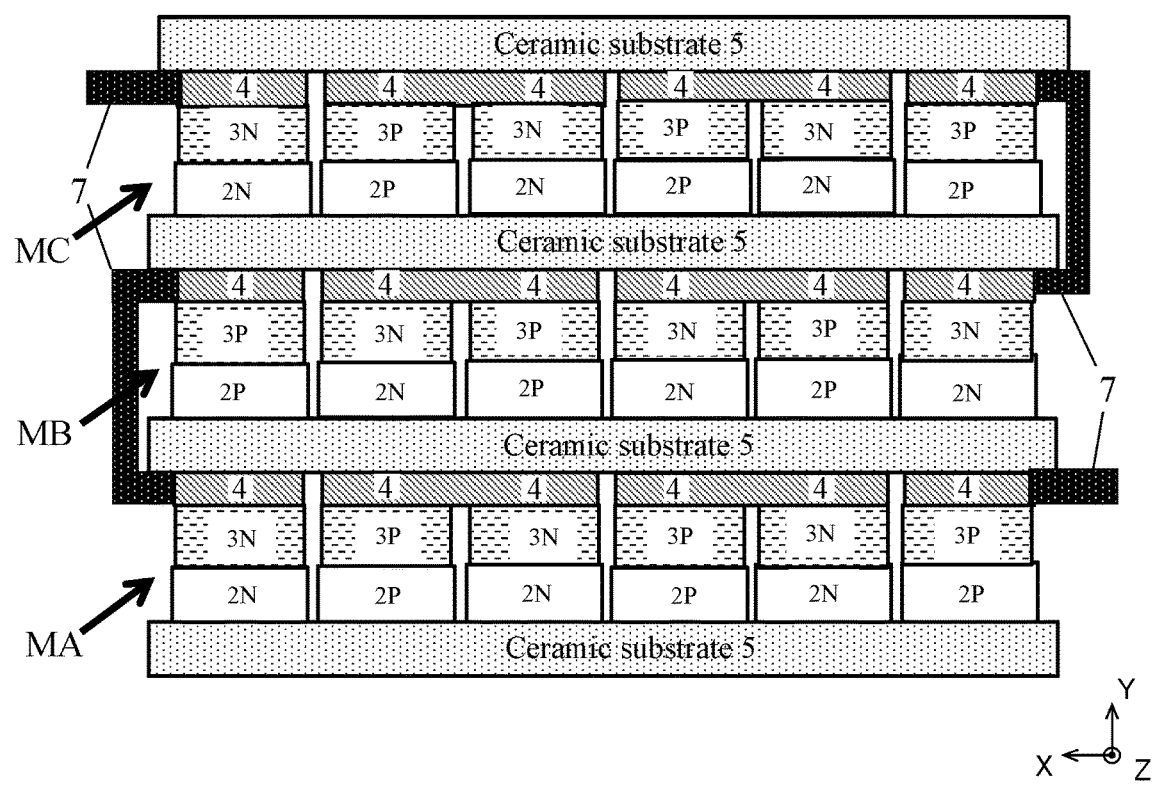

THERMOELECTRIC CONVERSION ELEMENT AND THERMOELECTRIC CONVERSION MODULE

TECHNICAL FIELD

The present invention relates to thermoelectric conversion elements and thermoelectric modules.

BACKGROUND ART

Thermoelectric conversion elements are known as clean energy conversion elements without the use of petroleum or ozone, and have been desired to be made more efficient, larger in area and thinner in recent years. For example, power generation elements using the Seebeck effect (thermoelectric conversion power generation elements) and cooling/heating elements using the Peltier effect (Peltier elements) have been under development.

The structure and the principle of such thermoelectric conversion elements are described. FIG. 3 is a conception diagram for illustrating a structure of a conventional thermoelectric conversion element.

A conventional thermoelectric conversion element 100 as shown in FIG. 3 is basically called a n-type thermoelectric conversion element, and composed of a plurality of electrodes opposed (metal electrodes) 120, 121, and 180; and a block body 130 made of an n-type thermoelectric semiconductor and a block body 131 made of a p-type thermoelectric semiconductor which are disposed between the electrodes. The block bodies 130 and 131 are electrically connected to each other by the electrode 180 at their ends on one side (junction end), and a block body of an n-type thermoelectric conversion semiconductor and a block body of a p-type thermoelectric conversion semiconductor are connected in series. The block bodies 130 and 131 are connected to the electrodes 120 and 121, respectively, at their ends on the other side.

In this configuration, if the temperature of the electrode 180 is made high and the temperature of the opposite electrode 120, 121 is made low, a temperature difference is provided therebetween, thermal energy is converted into electric energy by the Seebeck effect. Also, for example, by applying a direct current voltage between the electrode 180 and the electrodes 120, 121, and by passing a current from the electrode 120 in the direction of the electrode 121 via the electrode 180, the electrode 180 acts as an endothermic working electrode, the electrodes 120, 121 act as heat radiation working electrodes, and electric energy is converted into thermal energy by the Peltier effect.

Here, the endothermic energy in the case where the conventional thermoelectric conversion element is used as a Peltier element is discussed. The endothermic energy Q on an upper side of the electrode 180 is represented by the following equation (1):

$$Q = Q_P - Q_R - Q_K \quad (1),$$

wherein $Q_P$ is an amount of Peltier endotherm, $Q_R$ is an amount of Joule heat, and $Q_K$ is an amount of heat conduction (see FIG. 3).

Currently, the element structure of a practical thermoelectric conversion element has a block shape of a cross-sectional area S at about several $mm^2$ and a length L at about several mm. Multiple block bodies having such a shape are connected in series to be modularized, and a thermoelectric conversion element (Peltier element) whose heat absorption area (cooling area) is expanded by modularization has been put to practical use. However, such a n-type thermoelectric conversion element is about several mm in length L, so that radiation heat from the heat source directly affects the electrode of the low-temperature portion, therefore it is difficult to ensure the temperature difference between the electrodes. In addition, the shape is nonflexible, it is difficult to bring the electrode portions into close contact with the heat source or the cooling source, therefore there is a problem that it is difficult to secure a temperature difference between the electrodes.

To overcome the above problems, recently it has got actively developing a sheet-type thermoelectric conversion element, that is an element of forming thermoelectric conversion materials on a flexible insulating sheet and forming both a high-temperature electrode and a low-temperature electrode at each end surface of the sheet as shown in FIG. 2 (For example, see Non-Patent Document 1). Such a sheet-type thermoelectric conversion element has the structure to be able to take a certain distance between the high-temperature electrode and the low-temperature electrode in a plane, therefore the low-temperature electrode can avoid an influence of direct radiant heat from the heat source, as a result there is an advantage that it gets easy to secure a temperature difference between electrodes. Furthermore, the use of flexible sheets allows the electrode portion adhere to heat/cold sources, therefore it also gets easy to ensure the temperature difference between electrodes.

RELATED ART DOCUMENTS

Non-Patent Document 1: Yoshiyuki Nonoguchi, Kenji Ohashi, Rui Kanazawa, Koji Ashiba, Kenji Hata, Tetsuya Nakagawa, Chihaya Adachi, Tomoaki Tanase and Tsuyoshi Kawai, "Systematic Conversion of Single Walled Carbon Nanotubes into n-type Thermoelectric Materials by Molecular Dopants", Scientific Reports, Published 26 Nov. 2013, Volume 3, Article number: 3344, doi:10.1038/5rep03344.

SUMMARY OF THE INVENTION

Problems to be Solved by the Invention

However, in the sheet type thermoelectric conversion element, due to the element structure in which the thickness of the thermoelectric conversion material layer is thin and the distance between the high temperature electrode and the low temperature electrode is long, there is a problem that the internal resistance of the thermoelectric conversion material layer becomes high, therefore, it is difficult to obtain a large output.

Further, conventional thermoelectric conversion elements have been developed by concurrently letting three characteristics have in thermoelectric conversion materials, which are high Seebeck coefficient (thermoelectric force), high electric conductivity, and low thermal conductivity. However, it is difficult to obtain a material that simultaneously satisfies these three properties, in particular, if a thermoelectric conversion material having high electric conductivity is used to improve the internal resistance of the thermoelectric conversion material layer, the Seebeck coefficient decreases (See FIG. 4), as a result, there is a problem that it is impossible to obtain a large output.

Means for Solving the Problems

According to the present invention, a thermoelectric conversion element may comprise at least a charge transport layer, a thermoelectric conversion material layer and electrodes, wherein the charge transport layer comprises graphite treated to dope charge-donating materials so that the graphite has an n-type semiconductor property, or graphite treated to dope charge-accepting materials so that the graphite has a p-type semiconductor property.

Further, according to the present invention, an n-type thermoelectric conversion element may comprise at least an n-type charge transport layer, n-type thermoelectric conversion material layers and electrodes, wherein the n-type charge transport layer comprises graphite treated to dope charge-donating materials so that the graphite has an n-type semiconductor property, and the n-type thermoelectric conversion material layers are formed on the both ends of the n-type charge transport layer, and the electrodes are formed on top of the n-type thermoelectric conversion material layers.

Further, according to the present invention, a p-type thermoelectric conversion element may comprise at least a p-type charge transport layer, p-type thermoelectric conversion material layers and electrodes, wherein the p-type charge transport layer comprises graphite treated to dope charge-accepting materials so that the graphite has a p-type semiconductor property, and the p-type thermoelectric conversion material layers are formed on the both ends of the p-type charge transport layer, and the electrodes are formed on top of the p-type thermoelectric conversion material layers.

Further, according to the present invention, the charge-donating materials in the thermoelectric conversion element may comprise at least one of the group consisting of tetrathiafulvalene (TTF), tetramethyl-tetrathiafulvalene (TMTTF), bis-ethylenedithio-tetrathiafulvalene (BEDT-TTF), Tetraselenafulvalene (TSF), triphenylphosphine (TPP), trimethoxyphenylphosphine (MeO-TPP), trifluoride-triphenylphosphine (F-TPP), diphenylphosphine (DPP), bis-diphenylphosphino-ethane (DPPE), bis-diphenylphosphino-propane (DPPP), amines, polyamines, polyethyleneimine, sodium-carbonate, lithium-carbonate, potassium-carbonate, Cu-phthalocyanine, Zn-phthalocyanine and the like, derivatives thereof.

Further, according to the present invention, the charge-accepting materials in the thermoelectric conversion element may comprise at least one of the group consisting of tetracyanoquinodimethane (TCNQ), tetrafluoro-tetracyano-quinodimethane (TCNQF4), dicyclopentyldimethoxysilane-dicyanobenzoquinone (DDQ), trinitrofluorenone (TNF), dinitro-fluorenone (DNF), carbazole, 9H-carbazole-4ol, 2-hydroxy-9H-carbazole, phenyl-boronic-acid, pyridine, quinoline, imidazole, triphenylamine and the like, and derivatives thereof.

Further, according to the present invention, the thermoelectric conversion material layers in the thermoelectric conversion element may comprise at least one of carbon nanotubes, Bi—Te based compounds, oxides, or combinations of these materials.

Further, according to the present invention, a thermoelectric conversion module may be constituted by connecting at least one of the above-mentioned n-type thermoelectric conversion elements and at least one of the above-mentioned p-type thermoelectric conversion elements in series or in parallel, or in a combination of series and parallel.

Further, in the present invention, the thermoelectric conversion element has further an insulating substrate, wherein, the insulating substrate may be a composite substrate formed by joining two pieces of a second substrates to both ends of a first substrate, and the second substrate may be made of insulating materials having higher thermal conductivity than that of the first substrate, wherein, the charge transport layer is formed on the insulating substrate, and the thermoelectric conversion material layers are formed on the doped layer at both ends of the charge transport layer.

Further, in the present invention, thermoelectric conversion material layers may be formed on the doped layer at both ends of the charge transport layer and passivation film may be formed on the exposed portion of the doped layer of the central part of the charge transport layer where the thermoelectric conversion material layer is not formed.

Further, according to the present invention, a thermoelectric conversion module may be constituted by connecting at least two or more of the above-mentioned thermoelectric conversion elements in series or in parallel or in a combination of series and parallel.

Effects of the Invention

The thermoelectric conversion element of the present invention is characterized in using the graphite surface as the charge transfer layer which is doped with either charge-donating materials or charge-accepting materials so that the graphite surface has either an n-type or a p-type semiconductor property. Electric conductivity of the graphite surface having semiconductor property is more than 100 times high as compared with that of conventional thermoelectric conversion materials. Also, it hardly causes heat generating/absorbing even if it contacts with thermoelectric conversion materials. Further, the graphite surface doped with charge-donating materials or charge-accepting materials has lower thermal conductivity.

The present invention, by using the graphite surface pretreated so that the graphite surface has an n-type or a p-type semiconductor property as a charge transport layer, it is possible to lower the internal resistance of the sheet-type thermoelectric conversion element. The sheet type thermoelectric conversion element has a structure having a certain distance in a plane between the high temperature electrode and the low temperature electrode, therefore there is an advantage that a large temperature difference can be secured between the electrodes. Further, materials having high Seebeck coefficient can be selected as n-type or p-type thermoelectric conversion materials formed on the both end surfaces of the charge transport layer. By providing a charge transport layer to thermoelectric conversion materials, it becomes possible to use the thermoelectric conversion materials which have not been used so much up to now because of their very low electric conductivity even though the Seebeck coefficient is high. As a result, it has got possible to provide a thermoelectric conversion element of the large output unprecedented.

Further, in the present invention, a passivation film is formed on the portion exposed the doped layer of the charge transport layer, thus it is possible to provide a time stable thermoelectric conversion element.

Further, in the present invention, by using an insulating substrate in which an insulating material having high thermal conductivity and an insulating material having low thermal conductivity are combined, it can provide an excellent thermoelectric conversion module which one end portion of the laminated modules functions effectively as a heating/high-temperature section and another end portion of the laminated modules functions effectively as a cooling/low-temperature section.

The present invention provides a thermoelectric conversion element and a thermoelectric conversion module having such excellent thermoelectric performances, and provides a clean new energy conversion technology.

BRIEF DESCRIPTION OF THE DRAWINGS

FIG. 6 is a schematic diagram of a thermoelectric conversion module according to Embodiment 3 of the present invention. (1) shows a perspective view of the thermoelectric conversion module, (2) shows a sectional view taken along line E-E of the thermoelectric conversion module in (1).

MODE FOR CARRYING OUT THE INVENTION

[Thermoelectric Conversion Element of Present Invention]

Figure 1:
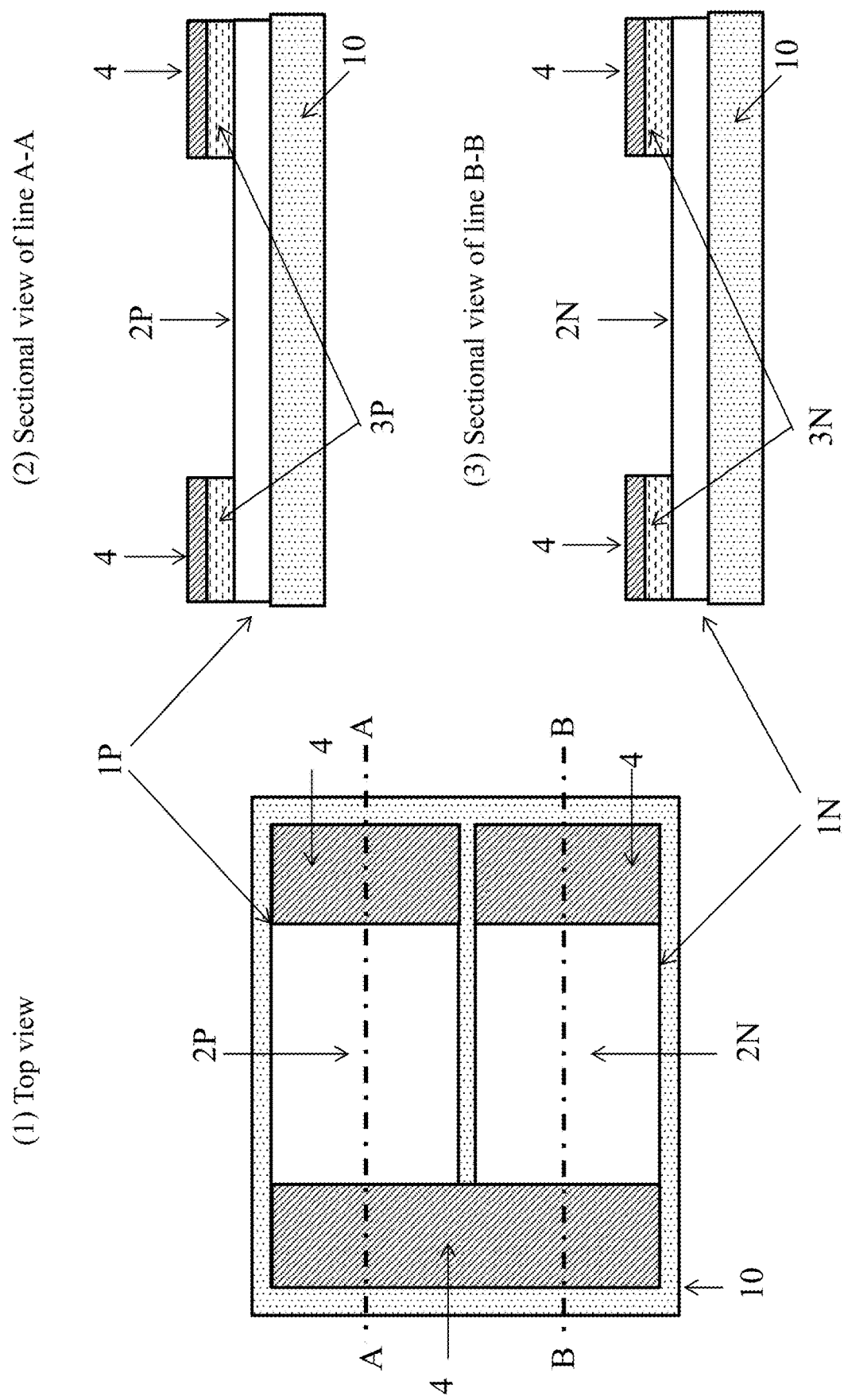
FIG. 1 is a top view, and a sectional view of a thermoelectric conversion element A according to Embodiment 1 of the present invention.

Graphite has anisotropy with respect to electric conduction characteristics, and the sheet manufactured from natural graphite has electric conductivities in the in-plane direction at approximately 2,000 to 10,000 S/cm, an electric conductivity in the thickness direction at approximately 1 S/cm. A graphite sheet obtained by graphitization of a sheet of a polymer such as polyimide has electric conductivities in the in-plane direction at approximately 10000 to 25000 S/cm and an electric conductivity in a thickness direction at approximately 5 S/cm. And, the thermoelectric conversion material has an electric conductivity of approximately 500 to 1000 S/cm, therefore either of the graphite sheets can be used as an effective charge transport layer by using the high electric conductivity in the in-plane direction of the graphite.

Upon use of graphite as a charge transport layer, the graphite is pretreated so that the graphite has n-type or p-type semiconductor property in order to perform carrier transport without energy loss between the graphite and the thermoelectric conversion materials. As methods for pretreatment, it is able to use methods for transforming carbon nanotubes or graphene into an n-type or a p-type semiconductor.

As methods for transforming the graphite into n-type semiconductor, it is able to use a method of heat-treating the graphite under potassium atmosphere, or a method of doping charge-donating materials and the like.

As the charge-donating materials for doping, it can be used at least one of the group consisting of tetrathiafulvalene (TTF), tetramethyl-tetrathiafulvalene (TMTTF), bis-ethylenedithio-tetrathiafulvalene (BEDT-TTF), Tetraselenafulvalene (TSF), triphenylphosphine (TPP), trimethoxyphenylphosphine (MeO-TPP), trifluoride-triphenylphosphine (F-TPP), diphenylphosphine (DPP), bis-diphenylphosphino-ethane (DPPE), bis-diphenylphosphino-propane (DPPP), amines, polyamines, polyethyleneimine, sodium-carbonate, lithium-carbonate, potassium-carbonate, Cu-phthalocyanine, Zn-phthalocyanine and the like, and derivatives thereof.

As methods for transforming the graphite into p-type semiconductor, it is able to use a method of introducing lattice defects into the graphite, or a method of doping charge-accepting materials and the like.

As the charge-accepting materials for doping, it can be used at least one of the group consisting of tetracyanoquinodimethane (TCNQ), tetrafluoro-tetracyanoquinodimethane (TCNQF4), dicyclopentyldimethoxysilane-dicyanobenzoquinone (DDQ), trinitrofluorenone (TNF), dinitrofluorenone (DNF), carbazole, 9H-carbazole-4ol, 2-hydroxy-9H-carbazole, phenyl-boronic-acid, pyridine, quinoline, imidazole, triphenylamine and the like, and derivatives thereof.

Further, it was found that the thermal conductivity of the graphite surface is greatly reduced by doping with charge-donating materials or charge-accepting materials. The following is known, phonon propagation of graphite propagates two-dimensionally on the graphite surface, unlike the case where phonons propagate in bulk solid three-dimensionally, therefore, by injecting lattice defects into the graphite surface, the average free path of the phonons gets equal to the distance between the lattice defects, as a result, the thermal conductivity is greatly reduced. The cause of this reduction of the thermal conductivity in the present invention is considered that the doping elements instead of the lattice defects play role to inhibit the two-dimensional propagation of phonons.

(1)

As the thermoelectric conversion materials in the present invention, it can be used at least one of the group consisting of carbon nanotubes, Bi—Te based compounds, or oxides.

For the formation of carbon nanotubes, it is known a CVD method using methane or acetylene as a raw material and a laser ablation method irradiating a laser beam to graphite. In the present invention, carbon nanotubes are prepared by filtering commercially available carbon nanotube dispersions. In order to produce n-type carbon nanotubes, carbon nanotubes are doped with charge-donating materials, and in order to produce p-type carbon nanotubes, carbon nanotubes are doped with charge-accepting materials. As a doping method, an organic solvent is prepared so as to contain a few wt % of each dopant of charge-donating materials or charge-accepting materials, and an amount predetermined of carbon nanotubes is provided, and it is added to the organic solvent, and after mixing and stirring the solvent, it is filtered, then after putting the filtration residue into a mold, it is heated and dried. In this manner, the thermoelectric conversion material layer is formed.

As the charge-donating materials for doping, it can be used at least one of the group consisting of tetrathiafulvalene (TTF), tetramethyl-tetrathiafulvalene (TMTTF), bis-ethylenedithio-tetrathiafulvalene (BEDT-TTF), Tetraselenafulvalene (TSF), triphenylphosphine (TPP), trimethoxyphenylphosphine (MeO-TPP), trifluoride-triphenylphosphine (F-TPP), diphenylphosphine (DPP), bis-diphenylphosphino-ethane (DPPE), bis-diphenylphosphino-propane (DPPP), amines, polyamines, polyethyleneimine, sodium-carbonate, lithium-carbonate, potassium-carbonate, Cu-phthalocyanine, Zn-phthalocyanine and the like, and derivatives thereof.

As the charge-accepting materials for doping, it can be used at least one of the group consisting of tetracyanoquinodimethane (TCNQ), tetrafluoro-tetracyanoquinodimethane (TCNQF4), dicyclopentyldimethoxysilane-dicyanobenzoquinone (DDQ), trinitrofluorenone (TNF), dinitrofluorenone (DNF), carbazole, 9H-carbazole-4ol, 2-hydroxy-9H-carbazole, phenyl-boronic-acid, pyridine, quinoline, imidazole, triphenylamine and the like, and derivatives thereof.

(2)

Figure 4:
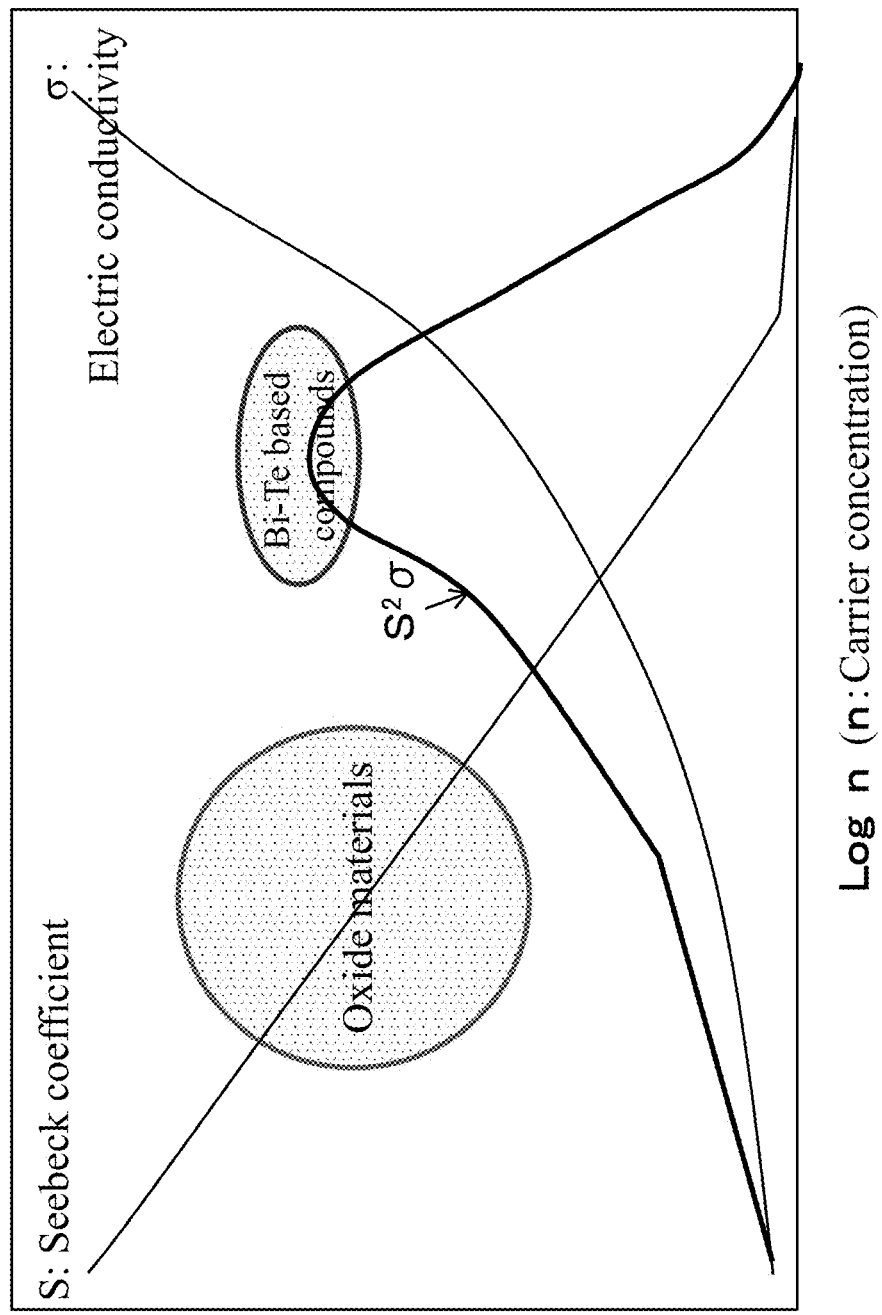
FIG. 4 is a schematic diagram for showing thermoelectric performance characteristics (room temperature) of thermoelectric conversion materials.

In general, thermoelectric performance characteristics of the thermoelectric conversion material is represented by the product ($S^2\sigma$) of the square of Seebeck coefficient (S) and electric conductivity ($\sigma$), as shown in FIG. 4, there are Bi—Te based compounds in the vicinity of the maximum value. Examples of Bi—Te based compounds, it is preferred to use Bi—Te—Se based compounds (n-type thermoelectric conversion material) and Bi—Te—Sb based compounds (p-type thermoelectric conversion material) that are superior to thermoelectric performance characteristics in the range from room temperature to 500 K.

Because Bi, Te, Se, Sb and the like are rare metals and expensive, there is a problem that it is difficult to supply sufficiently to market demand. Therefore, in addition to the Bi—Te based compounds, we would examine to use oxide materials which have not been much used up to now as thermoelectric conversion materials because of their very low electric conductivity even though the Seebeck coefficient is high.

As the oxide materials, is not particularly limited, it is preferable to use metal oxides such as FeO, $Fe_2O_3$, $Fe_3O_4$, CuO, $Cu_2O$, ZnO, $Zn_{1-x}Al_xO$, MnO, NiO, CoO, $TiO_2$, $SrTiO_3$.

In the structure of a conventional thermoelectric conversion element, the three characteristics of high Seebeck coefficient, high electric conductivity, and low thermal conductivity are required for a thermoelectric conversion material. Therefore, it was difficult to use the oxide materials as a thermoelectric conversion material, because the electric conductivity of those is very low in the range 0.5 S/cm or less even if the Seebeck coefficient of those is high in the range 300 to 1000 µV/K.

However, in the thermoelectric conversion element having a charge transport layer of the present invention, the charge transport layer made of graphite plays a role for electrical conduction, and a sheet-type element structure which can easily secures a temperature difference between electrodes plays a role for heat conduction, and the thermoelectric conversion material layer has an advantage that only the Seebeck coefficient needs to be high. Therefore, it is possible to effectively use the oxide materials having high Seebeckcoefficient, and it is possible to improve greatly the output of the thermoelectric conversion element.

(3)

[Thermoelectric Conversion Module of Present Invention]

Figure 5:
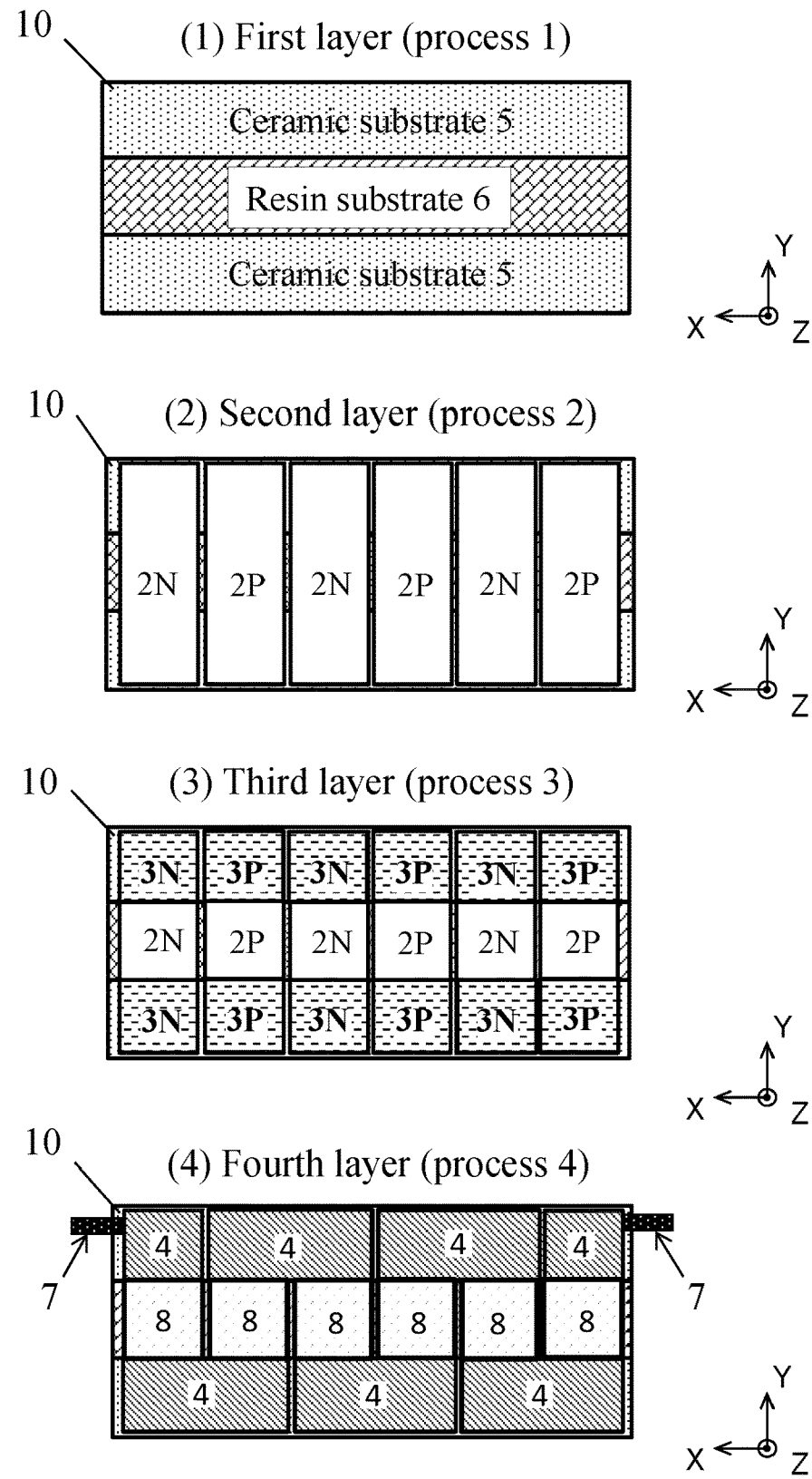
FIG. 5 is an explanatory diagram for showing an example of production processes of a thermoelectric conversion module according to Embodiment 2 of the present invention. (1) shows the first layer (process 1) of the thermoelectric conversion module, (2) shows the second layer (process 2) of the thermoelectric conversion module, (3) shows the third layer (process 3) of the thermoelectric conversion module, (4) shows the forth layer (process 4) of the thermoelectric conversion module.

The thermoelectric conversion module of the Embodiment 2 as shown in FIG. 5 in the present invention is arranged a large number of thermoelectric conversion elements in series on an insulating substrate, wherein the thermoelectric conversion element comprises an insulating substrate, a charge transport layer, thermoelectric conversion material layers, and electrodes, wherein the charge transport layer comprises either an n-type charge transport layer treated by doping charge-donating materials into the graphite surface or a p-type charge transport layer treated by doping charge-accepting materials into the graphite surface.

As shown in FIG. 5(2), a plurality of n-type charge transport layers 2N and p-type charge transport layers 2P are alternately disposed on one side of the insulating substrate while being spaced apart from each other at predetermined intervals.

Next, as shown in FIG. 5(3), n-type thermoelectric conversion material layers 2N are formed on the both end surfaces of the n-type charge transport layers 2N, and p-type thermoelectric conversion material layers 3P are formed on the both end surfaces of the p-type charge transport layers 2P, respectively.

Next, as shown in FIG. 5(4), electrodes 4 are formed on the thermoelectric conversion material layers in the third layer of FIG. 5(3) so as to be in contact with both an n-type thermoelectric conversion material layer 3N and a p-type thermoelectric conversion material layer 3P, thus it becomes a structure which a plurality of n-type thermoelectric conversion material layers 3N and a plurality of p-type thermoelectric conversion material layers 3P are connected in series.

Further, passivation films 8 are formed on the surface where the doped layer is exposed, of the central portions of the n-type charge transport layers 2N and the p-type charge transport layers 2P where the thermoelectric conversion material layers are not formed.

As the passivation film 8, it is preferable to use nitride film such as silicon-nitride, aluminum-nitride, or carbide film such as silicon carbide, or fluorine resins such as polytetrafluoroethylene, polyvinylidene fluoride, tetrafluoroethylene-hexafluoropropylene.

(4)

As shown in FIG. 6(1),(2), the thermoelectric conversion module according to the Embodiment 3 of the present invention has a structure in which the thermoelectric conversion modules MA, MB, MC are stacked in the thickness direction and are connected electrically. In this case, since the end portion of the thermoelectric conversion module acts as a heating/high-temperature portion or a cooling/low-temperature portion, it is preferable to have a good thermal conductivity at each end portion between each of the thermoelectric conversion module. In contrast, it is preferable to have a low thermal conductivity as much as possible between the heating/high-temperature section and the cooling/low-temperature section. In order to realize such a thermoelectric conversion module structure, it is preferable to use a composite substrate, of which both ends are made of insulating materials having high thermal conductivity, and of which the central portion is made of insulating materials having low thermal conductivity, as shown in FIG. 5(1).

As the substrates comprising insulating materials having high thermal conductivity, it is preferable to use ceramic substrates made of aluminum-nitride, silicon-carbide, alumina and the like, or insulating substrates coated with aluminum-nitride, silicon-carbide, alumina and the like.

The FIG. 6(2) shows a cross-sectional view of an end portion of the thermoelectric conversion module using the ceramic substrate 5 as the insulating substrate. The entire of the end portion has the structure having a high thermal conductivity.

As the substrates comprising insulating materials having low thermal conductivity, it is preferable to use plastic resin substrates made of polyethylene, polypropylene, polystyrene, polyethylene terephthalate, methacrylate resin, phenol resin, melamine resin, polyurethane, polycarbonate, epoxy resin and the like, or composite resin substrates obtained by mixing powder of glass fiber, silicon oxide, alumina in the plastic resin materials, or porous ceramic substrates such as porous silicon, porous alumina, or the like.

Figure 7:
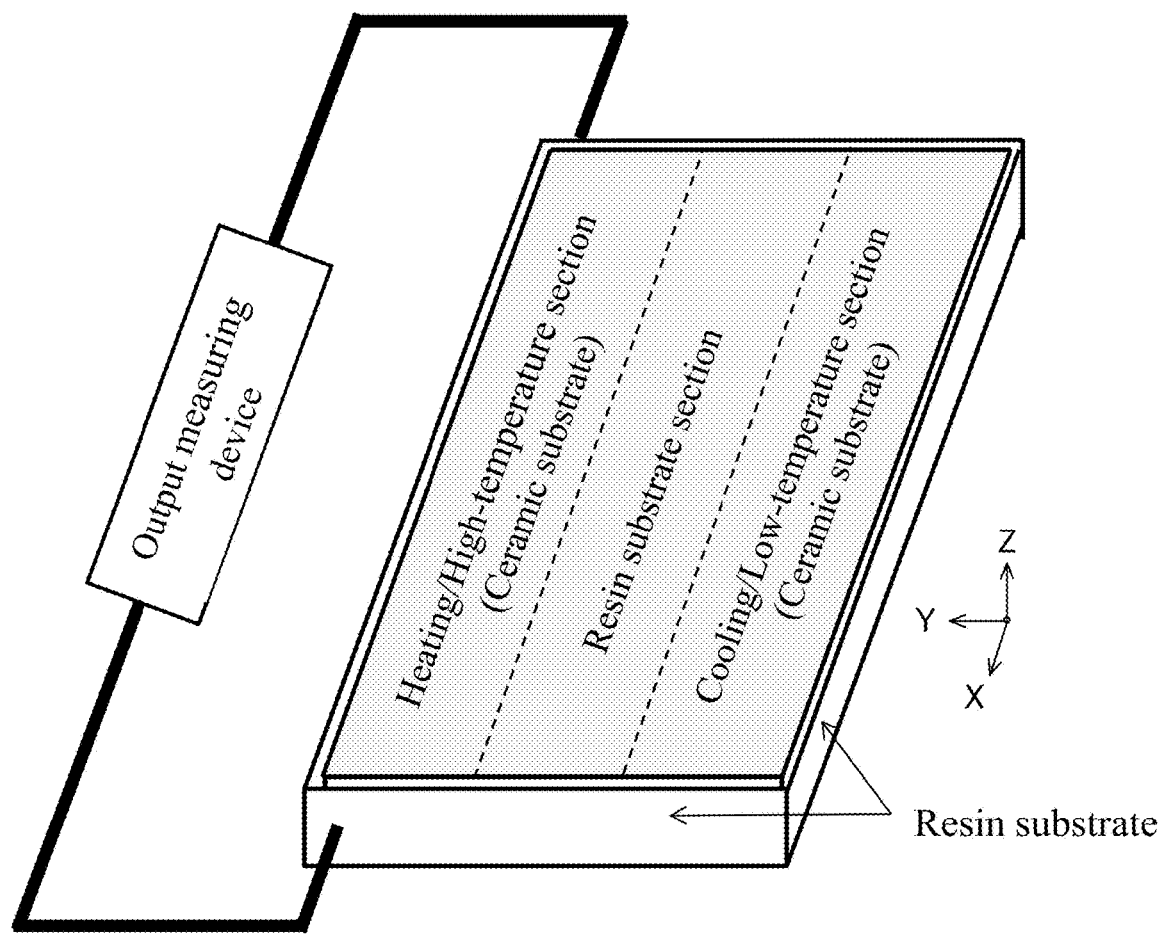
FIG. 7 is an explanatory view for showing a connection example between a thermoelectric conversion module and an output measuring device according to Embodiment 2 or 3 of the present invention.

As shown in FIG. 7, by using an insulating substrate of the present invention, one end portion of the laminated thermoelectric conversion modules functions effectively as a heating/high-temperature section, the other end portion of the laminated thermoelectric conversion modules functions effectively as a cooling/low-temperature section, therefore excellent thermoelectric conversion performances can be realized.

Next, the thermoelectric conversion element according to the Embodiment 1 is described based on FIG. 1.

Embodiment 1

The thermoelectric conversion element A according to the Embodiment 1 is described. FIG. 1 is a drawing of a thermoelectric conversion element A. FIG. 1(1) is the top view, FIG. 1(2) is the sectional view taken along the line A-A in FIG. 1(1), and FIG. 1(3) is the sectional view taken along the line B-B in FIG. 1(1).

As shown in FIG. 1, the thermoelectric conversion element A according to the present embodiment is composed of an n-type thermoelectric conversion section 1N and a p-type thermoelectric conversion section 1P which are formed apart from each other on an insulating substrate 10 having heat resistance and insulating properties, and electrodes 4. The n-type thermoelectric conversion section 1N is laminated in this order of a charge transport layer 2N, n-type thermoelectric conversion material layers 3N on the insulating substrate 10. The p-type thermoelectric conversion section 1P is laminated in this order of a charge transport layer 2P, p-type thermoelectric conversion material layers 3P on the insulating substrate 10.

In the present embodiment, graphite sheets pretreated so that the graphite sheets have an n-type or a p-type semiconductor property are used as charge transport layers 2N and 2P. As the graphite sheets, PGS graphite sheets which are obtained by graphitizing polymer sheets of polyimide and the like are used. The thickness of the graphite sheets is not particularly limited, but graphite sheets having a thickness of approximately 50 to 300 μm are used.

The pretreatment for giving an n-type property is as follows, a Dimethyl sulfoxide (DMSO) solution is prepared so as to contain n-type dopants at 5 wt %, wherein n-type dopants are charge-donating materials such as triphenylphosphine (TPP), diphenyl phosphate phono propane (DPPP), trimethoxyphenyl phosphine (MeO-TPP), and this solution is applied to the graphite sheet surface, then it is heated at 200° C. under $N_2$ atmosphere. This process is repeated five times to ensure that the charge-donating materials are doped on the graphite surface. The graphite sheets pretreated in this way are used as the charge transport layer 2N of n-type thermoelectric conversion section 1N.

The pretreatment for giving a p-type property is as follows, a Dimethyl sulfoxide (DMSO) solution is prepared so as to contain p-type dopants at 5 wt %, wherein p-type dopants are charge-accepting materials such as tetracyanoquinodimethane (TCNQ), 4-hydroxy-9H-carbazole, or carbazole, and this solution is applied to the graphite sheet surface, then it is heated at 200° C. under $N_2$ atmosphere. This process is repeated five times to ensure that the charge-donating materials are doped on the graphite surface. The graphite sheets pretreated in this way are used as the charge transport layer 2P of p-type thermoelectric conversion section 1P.

In the present embodiment, the n-type thermoelectric conversion material layer 3N and the p-type thermoelectric conversion material layer 3P can be made of at least one of carbon nanotubes, Bi—Te based compounds, oxides, or combinations of these materials. The thermoelectric conversion material layers may be formed of a plate-like thermoelectric conversion material cut out a sintered body, or may be formed by a well-known method such as a vapor deposition, a sputtering and a CVD method. Alternatively, converting thermoelectric conversion materials into a paste, and the thermoelectric conversion material layers may be formed by printing and heating the paste in a screen printing method or a doctor blade method or the like.

In the case of carbon nanotube materials, carbon nanotubes (density: 0.5 g/cm³) are prepared by filtering commercially available carbon nanotube dispersions.

In order to produce n-type carbon nanotubes, Carbon nanotubes of 5 mg are added in a Dimethyl sulfoxide (DMSO) solution of 10 ml containing n-type dopant at 5 wt %, wherein the n-type dopant is charge-donating materials such as triphenylphosphine (TPP), diphenyl phosphate phono propane (DPPP), trimethoxyphenyl phosphine (MeO-TPP), and after mixing and stirring the solvent it is filtered, then, after putting the filtration residue into a mold, it is heated and dried at 130° C. for 20 minutes. In this manner, the thermoelectric conversion material layer comprising n-type carbon nanotubes is formed.

In order to produce p-type carbon nanotubes, Carbon nanotubes of 5 mg are added in a Dimethyl sulfoxide (DMSO) solution of 10 ml containing p-type dopant at 5 wt %, wherein the p-type dopant is charge-donating materials such as tetracyanoquinodimethane (TCNQ), 4-hydroxy-9H-carbazole, or carbazole, and after mixing and stirring the solvent it is filtered, then, after putting the filtration residue into a mold, it is heated and dried at 130° C. for 20 minutes. In this manner, the thermoelectric conversion material layer comprising p-type carbon nanotubes is formed.

In the case of Bi—Te based materials, the $Bi_2Te_{2.7}Se_{0.3}$ is used as n-type thermoelectric conversion materials, the $Bi_{0.5}Sb_{1.5}Te_3$ is used as p-type thermoelectric conversion materials. By using a powder (average particle diameter: approximately 3 μm) prepared by pulverizing Bi—Te based materials with the composition of $Bi_2Te_{2.7}Se_{0.3}$ or $Bi_{0.5}Sb_{1.5}Te_3$ which are produced by a melting method, each paste of Bi—Te based materials is prepared with the following formulation. These each paste is printed and baked at 150° C. for 10 minutes under $N_2$ atmosphere, thus thermoelectric conversion material layers are formed.

[Formulation of Paste of Bi—Te Based Material (Parts by Weight)]

Bi—Te based material powder: 100 parts
Terpineol: 12 parts
Ethylcellulose: 3 parts Further, in the case of oxide materials, an n-type thermoelectric conversion material layer 3N is formed of iron oxide ($Fe_2O_3$), or zinc oxide (ZnO), and a p-type thermoelectric conversion material layer 3P is formed of copper oxide ($Cu_2O$). In this embodiment, iron oxide ($Fe_2O_3$), zinc oxide (ZnO) and copper oxide ($Cu_2O$) are formed by an ion plating method. As a target, Fe, Zn, Cu are used respectively, they are heated by an electron gun. As reactive gases, oxygen gas at 15 to 20 sccm, the nitrogen gas at 3 to 5 sccm are provided under reduced pressure of $10^{-3}$ Pa, their gases are reacted in a plasma which is generates by a high frequency, thus oxide films are formed on the substrate (graphite). The oxide films having a thickness of about 0.3 μm are formed under conditions of a substrate temperature at 130° C., a high-frequency power output at 300 W, a substrate bias at 0 V, and a film forming rate of 0.5 to 1 nm/sec, then they are annealed at 150° C. for 10 minutes under $N_2$ atmosphere. In this manner, thermoelectric conversion material layers are formed on the graphite sheet.

As mentioned above in the present embodiment, the charge transport layers 2N and 2P made of graphite are formed on the substrate 10, and the thermoelectric conversion material layers 3N and 3P are laminated on the both end surfaces of the charge transport layer, wherein the thermoelectric conversion material layers 3N and 3P comprise at least one of Bi—Te based compounds, oxides, carbon nanotubes, a lamination of carbon nanotubes and Bi—Te based compounds, or a lamination of carbon nanotubes and oxides. Ag layers are formed by vapor deposition on the thermoelectric conversion material layers, and electrodes 4 are formed by attaching Al substrates with solder onto the Ag layers.

Through the above processes, the thermoelectric conversion element A (FIG. 1) according to Embodiment 1 is produced.

Comparative Embodiment 1

Figure 2:
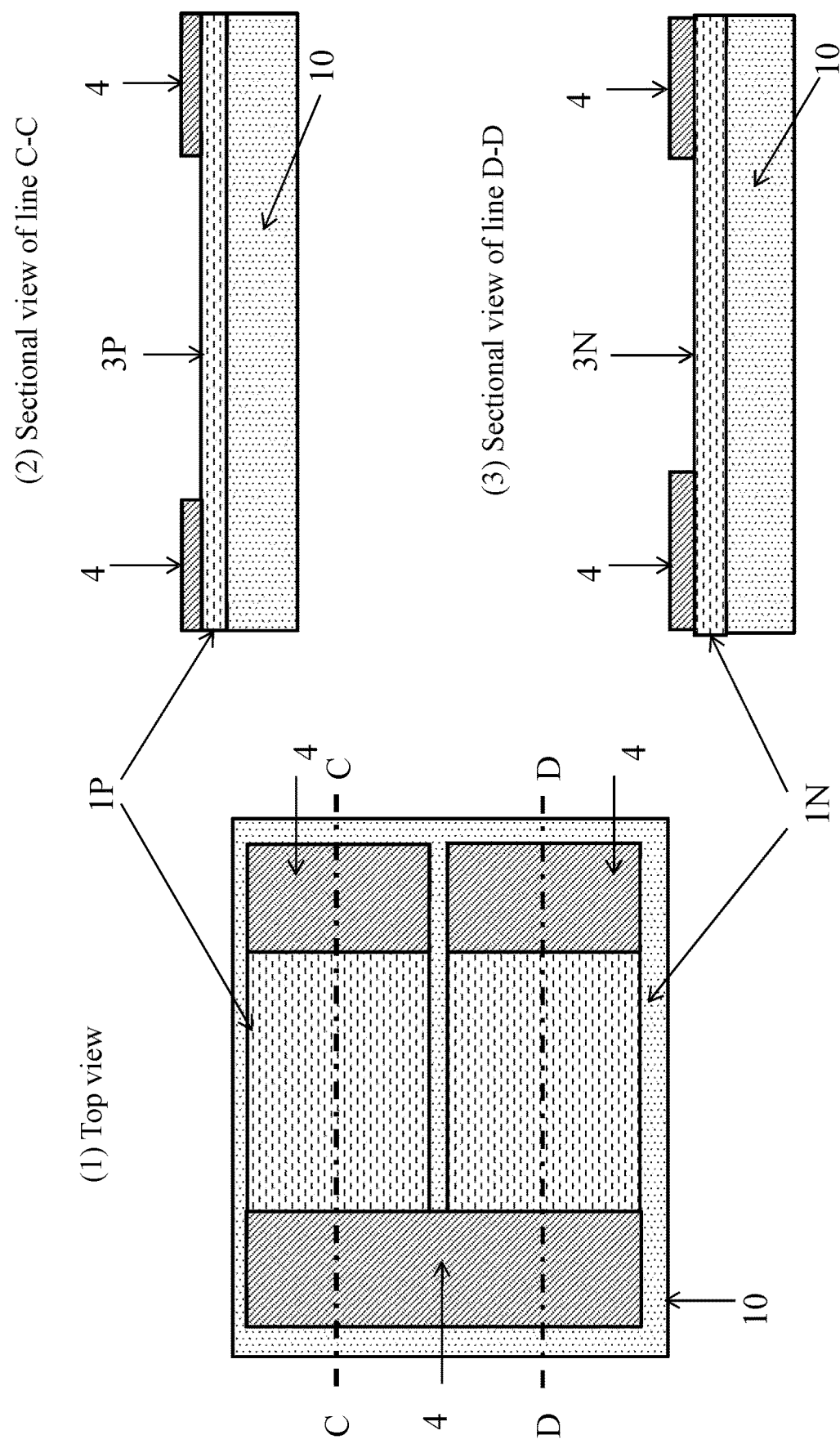
FIG. 2 is a top view, and a sectional view of a thermoelectric conversion element according to Comparative Embodiment 1 of the present invention.
Figure 3:
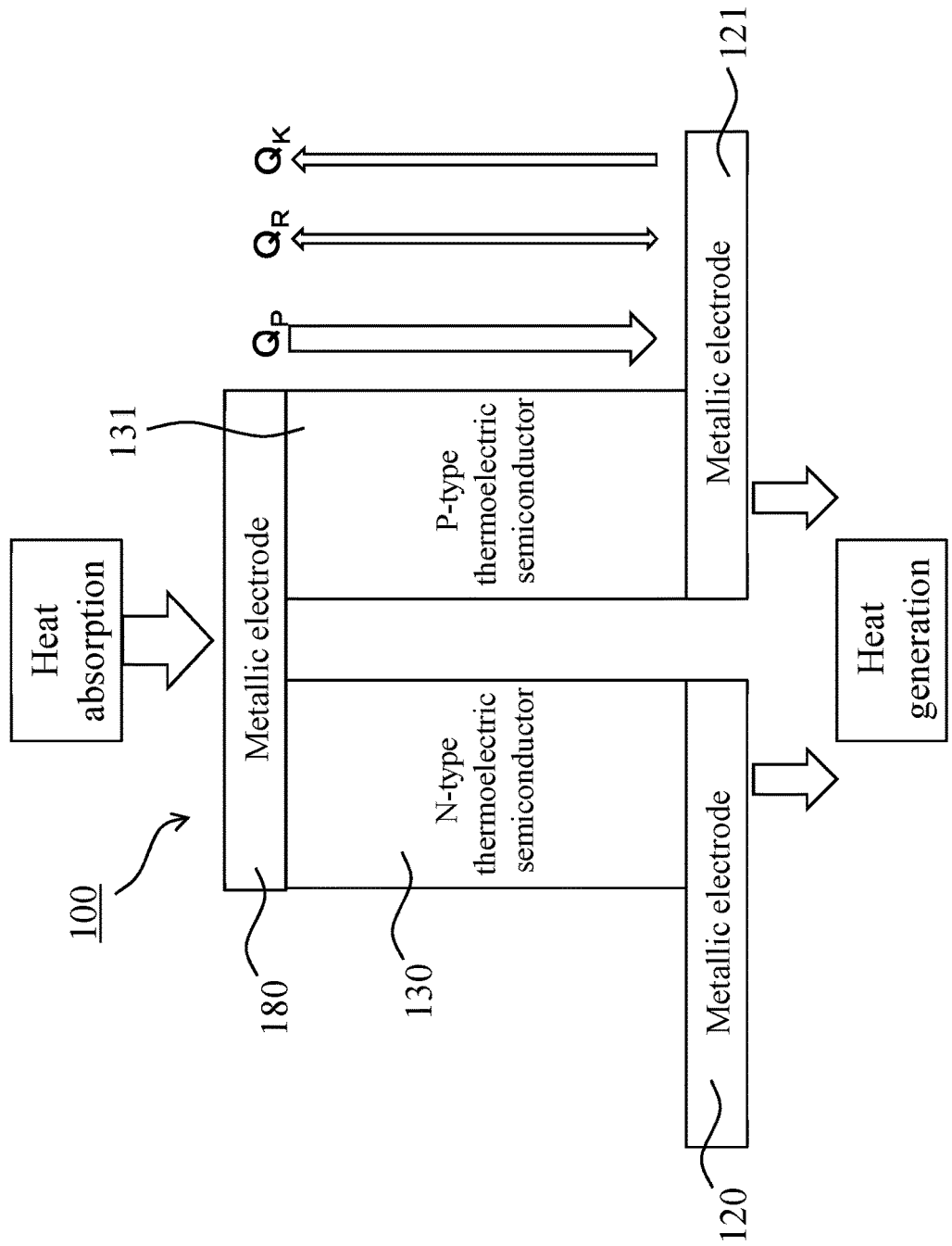
FIG. 3 is a conception diagram for illustrating a structure of a conventional thermoelectric conversion element.

The thermoelectric conversion element B according to the comparative Embodiment 1 is described. FIG. 2 is a drawing of a thermoelectric conversion element B. FIG. 2(1) is the top view, FIG. 2(2) is the sectional view taken along the line C-C in FIG. 2(1), and FIG. 2(3) is the sectional view taken along the line D-D in FIG. 2(1)

As shown in FIG. 2, in the thermoelectric conversion element B according to Comparative Embodiment 1, the thermoelectric conversion material layers 3N and 3P are formed on the insulating substrate 10, and it is different from Embodiment 1 that the charge transport layers 2N and 2P are not formed. Then the electrodes are formed on the both end surfaces of the thermoelectric conversion material layers 3N and 3P.

In this comparative Embodiment 1, the thermoelectric conversion material layers 3N and 3P are formed of Bi—Te based compounds, oxides, carbon nanotubes by the same processes as the Embodiment 1. In addition, the thermoelectric conversion element B (FIG. 2) according to the comparative Embodiment 1 is produced by the same processes as in Embodiment 1.

The Examples described below were produced as follows.

Example 1

The thermoelectric conversion element A(1) shown in Embodiment 1 (FIG. 1) was produced as described in (1-1) to (1-4) below.

(1-1)

A silicon resin sheet was provided by sides of 84 mm×102 mm and a thickness of 1 mm as the insulating substrate 10. A PGS graphite sheet doped with triphenylphosphine (TPP) of charge-donating materials (n-type dopant) was provided by sides of 40 mm×100 mm and a thickness of 100 μm as the charge transport layer 2N. The graphite sheet was disposed on the silicon resin sheet at the position of 1 mm inside from the edge of the silicon resin sheet. A heat-resistant adhesive was used to adhere.

Carbon nanotubes doped with triphenylphosphine (TPP) of charge-donating materials (n-type dopant) were formed into sides of 40 mm×20 mm and a thickness of 100 μm by a doctor blade method on the both end surfaces of the graphite sheet where were positions predetermined as the thermoelectric conversion material layer 3N as shown in FIG. 1, then they were heated and dried at 130° C. for 20 minutes.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(1-2)

Next, a PGS graphite sheet doped with tetracyanoquinodimethane (TCNQ) of charge-accepting materials (p-type dopant) was provided by sides of 40 mm×100 mm and a thickness of 100 μm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

Carbon nanotubes doped with tetracyanoquinodimethane (TCNQ) of charge-accepting materials (p-type dopant) were formed into sides of 40 mm×20 mm and a thickness of 100 μm by a doctor blade method on the both end surfaces of the graphite sheet where were positions predetermined as the thermoelectric conversion material layer 3P as shown in FIG. 1, then they were heated and dried at 130° C. for 20 minutes.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(1-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element A(1) composed of an n-type thermoelectric conversion section 1N and a p-type thermoelectric conversion section 1P was produced as described above. (See FIG. 1.)

(1-4)

10 pieces of the thermoelectric conversion element A(1) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element A(1) produced as described above, the output of the module was examined under the condition of one electrode end at 50° C. and the other electrode end at 0° C. The output of 1.80 mW was obtained, as shown in Table 1.

TABLE 1

| | Thermoelectric conversion material layer / Charge transport layer | dopant | Temperature difference ΔT (K) | Number of elements pieces | Module voltage mV | Module current mA | Module output mW |
|---|---|---|---|---|---|---|---|
| Example 1 | CNT (n-type)<br>graphite (n-type)<br>CNT (p-type)<br>graphite (p-type) | TPP (n-type)<br>TPP (n-type)<br>TCNQ (p-type)<br>TCNQ (p-type) | 50 | 10 | 30.0 | 60.0 | 1.80 |
| Example 2 | CNT (n-type)<br>graphite (n-type)<br>CNT (p-type)<br>graphite (p-type) | MeO—TPP (n-type)<br>MeO—TPP (n-type)<br>carbazole (p-type)<br>carbazole (p-type) | 50 | 10 | 33.5 | 66.8 | 2.24 |
| Example 3 | $Bi_2Te_{2.75}Se_{0.3}$ (n-type)<br>graphite (n-type)<br>$Bi_{0.5}Sb_{1.5}Te_3$ (p-type)<br>graphite (p-type) | DPPP (n-type)<br><br>9H-carbazole-4ol (p-type) | 50 | 10 | 88.5 | 177.0 | 15.7 |
| Example 4 | $Fe_2O_3$ (n-type)<br>graphite (n-type)<br>$Cu_2O$ (p-type)<br>graphite (p-type) | n-type: TPP (n-type)<br><br>p-type: TCNQ (p-type) | 50 | 10 | 268.3 | 530.3 | 142 |
| Example 5 | ZnO (n-type)<br>graphite (n-type)<br>$Cu_2O$ (p-type)<br>graphite (p-type) | n-type: MeO—TPP (n-type)<br><br>p-type: carbazole (p-type) | 50 | 10 | 324.0 | 638.2 | 207 |
| Example 6 | $Bi_2Te_{2.75}Se_{0.3}$ (n-type)<br>CNT (n-type)<br>graphite (n-type)<br>$Bi_{0.5}Sb_{1.5}Te_3$ (p-type)<br>CNT (p-type)<br>graphite (p-type) | n-type: DPPP (n-type)<br>n-type: DPPP (n-type)<br><br>9H-carbazole-4ol (p-type)<br>9H-carbazole-4ol (p-type) | 50 | 10 | 112.6 | 225.0 | 25.3 |
| Example 7 | $Fe_2O_3$ (n-type)<br>CNT (n-type)<br>graphite (n-type)<br>$Cu_2O$ (p-type)<br>CNT (p-type)<br>graphite (p-type) | TPP (n-type)<br>TPP (n-type)<br><br>TCNQ (p-type)<br>TCNQ (p-type) | 50 | 10 | 282.3 | 557.7 | 157 |
| Example 8 | ZnO (n-type)<br>CNT (n-type)<br>graphite (n-type)<br>$Cu_2O$ (p-type)<br>CNT (p-type)<br>graphite (p-type) | MeO—TPP (n-type)<br>MeO—TPP (n-type)<br><br>carbazole (p-type)<br>carbazole (p-type) | 50 | 10 | 337.6 | 662.7 | 224 |
| Comparative example 1 | CNT (n-type)<br>CNT (p-type) | TPP (n-type)<br>TCNQ (p-type) | 50 | 10 | 18.0 | 0.707 | 0.013 |
| Comparative example 2 | CNT (n-type)<br>CNT (p-type) | MeO—TPP (n-type)<br>carbazole (p-type) | 50 | 10 | 12.8 | 0.116 | 0.0015 |
| Comparative example 3 | $Bi_2Te_{2.75}Se_{0.3}$ (n-type)<br>$Bi_{0.5}Sb_{1.5}Te_3$ (p-type) | | 50 | 10 | 46.8 | 26.93 | 1.26 |
| Comparative example 4 | $Fe_2O_3$ (n-type)<br>$Cu_2O$ (p-type) | | 50 | 10 | 85.3 | 0.011 | 0.00093 |
| Comparative example 5 | ZnO (n-type)<br>$Cu_2O$ (p-type) | | 50 | 10 | 141.3 | 0.004 | 0.00061 |

Example 2

The thermoelectric conversion element A(2) shown in Embodiment 1 (FIG. 1) was produced as described in (2-1) to (2-4) below.

(2-1)

A silicon resin sheet was provided by sides of 84 mm×102 mm and a thickness of 1 mm as the insulating substrate 10. A PGS graphite sheet doped with trimethoxyphenylphosphine (MeO-TPP) of charge-donating materials (n-type dopant) was provided by sides of 40 mm×100 mm and a thickness of 100 μm as the charge transport layer 2N. The graphite sheet was disposed on the silicon resin sheet at the position of 1 mm inside from the edge of the silicon resin sheet. A heat-resistant adhesive was used to adhere.

Carbon nanotubes doped with trimethoxyphenylphosphine (MeO-TPP) of charge-donating materials (n-type dopant) were formed into sides of 40 mm×20 mm and a thickness of 100 μm by a doctor blade method on the both end surfaces of the graphite sheet where were positions predetermined as the thermoelectric conversion material layer 3N as shown in FIG. 1, then they were heated and dried at 130° C. for 20 minutes.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(2-2)

Next, a PGS graphite sheet doped with carbazole of charge-accepting materials (p-type dopant) was provided by sides of 40 mm×100 mm and a thickness of 100 μm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

Carbon nanotubes doped with carbazole of charge-accepting materials (p-type dopant) were formed into sides of 40 mm×20 mm and a thickness of 100 μm by a doctor blade method on the both end surfaces of the graphite sheet where were positions predetermined as the thermoelectric conversion material layer 3P as shown in FIG. 1, then they were heated and dried at 130° C. for 20 minutes.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(2-3)
Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element A(2) composed of an n-type thermoelectric conversion section 1N and a p-type thermoelectric conversion section 1P was produced as described above. (See FIG. 1.)

(2-4)
10 pieces of the thermoelectric conversion element A(2) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element A(2) produced as described above, the output of the module was examined under the condition of one electrode end at 50° C. and the other electrode end at 0° C. The output of 2.24 mW was obtained, as shown in Table 1.

Example 3

The thermoelectric conversion element A(3) shown in Embodiment 1 (FIG. 1) was produced as described in (3-1) to (3-4) below.

(3-1)
A silicon resin sheet was provided by sides of 84 mm×102 mm and a thickness of 1 mm as the insulating substrate 10. A PGS graphite sheet doped with bis-diphenylphosphinopropane (DPPP) of charge-donating materials (n-type dopant) was provided by sides of 40 mm×100 mm and a thickness of 100 μm as the charge transport layer 2N. The graphite sheet was disposed on the silicon resin sheet at the position of 1 mm inside from the edge of the silicon resin sheet. A heat-resistant adhesive was used to adhere.

As an n-type thermoelectric conversion material, $Bi_2Te_{2.7}Se_{0.3}$ was formed into sides of 40 mm×20 mm and a thickness of 100 μm by a screen printing method on the both end surfaces of the graphite sheet where were positions predetermined as the thermoelectric conversion material layer 3N as shown in FIG. 1, then they were heated at 150° C. for 10 minutes under $N_2$ atmosphere.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(3-2)
Next, a PGS graphite sheet doped with 9H-carbazole-4ol of charge-accepting materials (p-type dopant) was provided by sides of 40 mm×100 mm and a thickness of 100 μm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

As a p-type thermoelectric conversion material, $Bi_{0.5}Sb_{1.5}Te_3$ was formed into sides of 40 mm×20 mm and a thickness of 100 μm by a screen printing method on the both end surfaces of the graphite sheet where were positions predetermined as the thermoelectric conversion material layer 3P as shown in FIG. 1, then they were heated at 150° C. for 10 minutes under $N_2$ atmosphere.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(3-3)
Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element A(3) composed of an n-type thermoelectric conversion section 1N and a p-type thermoelectric conversion section 1P was produced as described above. (See FIG. 1.)

(3-4)
10 pieces of the thermoelectric conversion element A(3) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element A(3) produced as described above, the output of the module was examined under the condition of one electrode end at 50° C. and the other electrode end at 0° C. The output of 15.7 mW was obtained, as shown in Table 1.

Example 4

The thermoelectric conversion element A(4) shown in Embodiment 1 (FIG. 1) was produced as described in (4-1) to (4-4) below.

(4-1)
A silicon resin sheet was provided by sides of  mm× mm and 84 mm, a length of 102 mm, a thickness of 1 mm as the insulating substrate 10. A PGS graphite sheet doped with triphenylphosphine (TPP) of charge-donating materials (n-type dopant) was provided by sides of 40 mm×100 mm and a thickness of 100 μm as the charge transport layer 2N. The graphite sheet was disposed on the silicon resin sheet at the position of 1 mm inside from the edge of the silicon resin sheet. A heat-resistant adhesive was used to adhere.

As an n-type thermoelectric conversion material, $Fe_2O_3$ was formed into sides of 40 mm×20 mm and a thickness of 0.3 μm by an ion plating method on the both end surfaces of the graphite sheet where were positions predetermined as the thermoelectric conversion material layer 3N as shown in FIG. 1, then they were annealed at 150° C. for 10 minutes under $N_2$ atmosphere.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(4-2)

Next, a PGS graphite sheet doped with tetracyanoquinodimethane (TCNQ) of charge-accepting materials (p-type dopant) was provided by sides of 40 mm×100 mm and a thickness of 100 µm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

As a p-type thermoelectric conversion material, $Cu_2O$ was formed into sides of 40 mm×20 mm and a thickness of 0.3 µm by an ion plating method on the both end surfaces of the graphite sheet where were positions predetermined as the thermoelectric conversion material layer 3P as shown in FIG. 1, then they were annealed at 150° C. for 10 minutes under $N_2$ atmosphere.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(4-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 µm or, sides of 82 mm×20 mm and a thickness of 20 µm were fixed by soldering onto the Ag layers, and the electrodes 4 were formed.

The thermoelectric conversion element A(4) composed of an n-type thermoelectric conversion section 1N and a p-type thermoelectric conversion section 1P was produced as described above. (See FIG. 1.)

(4-4)

10 pieces of the thermoelectric conversion element A(4) produced as described above were connected in series to form a thermoelectric conversion element by using Al substrates having sides of 82 mm×20 mm and a thickness of 20 µm, and a laminate film was superposed on the top of the thermoelectric conversion element, then it was evacuated and heated at 200° C. and laminated to fabricate a module.

In the module composed of the thermoelectric conversion element A(4) produced as described above, the output of the module was examined under the condition of one electrode end at 50° C. and the other electrode end at 0° C. The output of 142 mW was obtained, as shown in Table 1.

Example 5

The thermoelectric conversion element A(5) shown in Embodiment 1 (FIG. 1) was produced as described in (5-1) to (5-4) below.

(5-1)

A silicon resin sheet was provided by sides of 84 mm×102 mm and a thickness of 1 mm as the insulating substrate 10. A PGS graphite sheet doped with trimethoxyphenylphosphine (MeO-TPP) of charge-donating materials (n-type dopant) was provided by sides of 40 mm×100 mm and a thickness of 100 µm as the charge transport layer 2N. The graphite sheet was disposed on the silicon resin sheet at the position of 1 mm inside from the edge of the silicon resin sheet. A heat-resistant adhesive was used to adhere.

As an n-type thermoelectric conversion material, ZnO was formed into sides of 40 mm×20 mm and a thickness of 0.3 µm by an ion plating method on the both end surfaces of the graphite sheet where were positions predetermined as the thermoelectric conversion material layer 3N as shown in FIG. 1, then they were annealed at 150° C. for 10 minutes under $N_2$ atmosphere.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(5-2)

Next, a PGS graphite sheet doped with carbazole of charge-accepting materials (p-type dopant) was provided by sides of 40 mm×100 mm and a thickness of 100 µm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

As a p-type thermoelectric conversion material, $Cu_2O$ was formed into sides of 40 mm×20 mm and a thickness of 0.3 µm by an ion plating method on the both end surfaces of the graphite sheet where were positions predetermined as the thermoelectric conversion material layer 3P as shown in FIG. 1, then they were annealed at 150° C. for 10 minutes under $N_2$ atmosphere.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(5-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 µm or, sides of 82 mm×20 mm and a thickness of 20 µm were fixed by soldering onto the Ag layers, and the electrodes 4 were formed.

The thermoelectric conversion element A(5) composed of an n-type thermoelectric conversion section 1N and a p-type thermoelectric conversion section 1P was produced as described above. (See FIG. 1.)

(5-4)

10 pieces of the thermoelectric conversion element A(5) produced as described above were connected in series to form a thermoelectric conversion element by using Al substrates having sides of 82 mm×20 mm and a thickness of 20 µm, and a laminate film was superposed on the top of the thermoelectric conversion element, then it was evacuated and heated at 200° C. and laminated to fabricate a module.

In the module composed of the thermoelectric conversion element A(5) produced as described above, the output of the module was examined under the condition of one electrode end at 50° C. and the other electrode end at 0° C. The output of 207 mW was obtained, as shown in Table 1.

Example 6

The thermoelectric conversion element A(6) shown in Embodiment 1 (FIG. 1) was produced as described in (6-1) to (6-4) below.

(6-1)

A silicon resin sheet was provided by sides of 84 mm×102 mm and a thickness of 1 mm as the insulating substrate 10. A PGS graphite sheet doped with bis-diphenylphosphinopropane (DPPP) of charge-donating materials (n-type dopant) was provided by sides of 40 mm×100 mm and a thickness of 100 μm as the charge transport layer 2N. The graphite sheet was disposed on the silicon resin sheet at the position of 1 mm inside from the edge of the silicon resin sheet. A heat-resistant adhesive was used to adhere.

Carbon nanotubes doped with bis-diphenylphosphinopropane (DPPP) of charge-donating materials (n-type dopant) were formed into sides of 40 mm×20 mm and a thickness of 100 μm by a doctor blade method on the both end surfaces of the graphite sheet where were positions predetermined as the thermoelectric conversion material layer 3N as shown in FIG. 1, then they were heated and dried at 130° C. for 20 minutes. $Bi_2Te_{2.7}Se_{0.3}$ was formed into sides of 40 mm×20 mm and a thickness of 100 μm on the top of the carbon nanotubes layers by a screen printing method, then they were heated at 150° C. for 10 minutes under $N_2$ atmosphere. In this manner, n-type thermoelectric conversion material layers 3N which were composed of a lamination of the carbon nanotube layer and the $Bi_2Te_{2.7}Se_{0.3}$ layer were formed.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(6-2)

Next, a PGS graphite sheet doped with 9H-carbazole-4ol of charge-accepting materials (p-type dopant) was provided by sides of 40 mm×100 mm and a thickness of 100 μm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

Carbon nanotubes doped with 9H-carbazole-4ol of charge-accepting materials (p-type dopant) were formed into sides of 40 mm×20 mm and a thickness of 100 μm by a doctor blade method on the both end surfaces of the graphite sheet where were positions predetermined as the thermoelectric conversion material layer 3P as shown in FIG. 1, then they were heated and dried at 130° C. for 20 minutes. $Bi_{0.5}Sb_{1.5}Te_3$ was formed into sides of 40 mm×20 mm and a thickness of 100 μm on the top of the carbon nanotubes layers by a screen printing method, then they were heated at 150° C. for 10 minutes under $N_2$ atmosphere. In this manner, p-type thermoelectric conversion material layers 3P which were composed of a lamination of the carbon nanotube layer and the $Bi_{0.5}Sb_{1.5}Te_3$ layer were formed.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(6-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element A(6) composed of an n-type thermoelectric conversion section 1N and a p-type thermoelectric conversion section 1P was produced as described above. (See FIG. 1.)

(6-4)

10 pieces of the thermoelectric conversion element A(6) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element A(6) produced as described above, the output of the module was examined under the condition of one electrode end at 50° C. and the other electrode end at 0° C. The output of 25.3 mW was obtained, as shown in Table 1.

Example 7

The thermoelectric conversion element A(7) shown in Embodiment 1 (FIG. 1) was produced as described in (7-1) to (7-4) below.

(7-1)

A silicon resin sheet was provided by sides of 84 mm×102 mm and a thickness of 1 mm as the insulating substrate 10. A PGS graphite sheet doped with triphenylphosphine (TPP) of charge-donating materials (n-type dopant) was provided by sides of 40 mm×100 mm and a thickness of 100 μm as the charge transport layer 2N. The graphite sheet was disposed on the silicon resin sheet at the position of 1 mm inside from the edge of the silicon resin sheet. A heat-resistant adhesive was used to adhere.

Carbon nanotubes doped with triphenylphosphine (TPP) of charge-donating materials (n-type dopant) were formed into sides of 40 mm×20 mm and a thickness of 100 μm by a doctor blade method on the both end surfaces of the graphite sheet where were positions predetermined as the thermoelectric conversion material layer 3N as shown in FIG. 1, then they were heated and dried at 130° C. for 20 minutes. $Fe_2O_3$ was formed into sides of 40 mm×20 mm and a thickness of 0.3 μm on the top of the carbon nanotubes layers by a screen printing method, then they were annealed at 150° C. for 10 minutes under $N_2$ atmosphere. In this manner, n-type thermoelectric conversion material layers 3N which were composed of a lamination of the carbon nanotube layer and the $Fe_2O_3$ layer were formed.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(7-2)

Next, a PGS graphite sheet doped with tetracyanoquinodimethane (TCNQ) of charge-accepting materials (p-type dopant) was provided by sides of 40 mm×100 mm and a thickness of 100 μm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

Carbon nanotubes doped with tetracyanoquinodimethane (TCNQ) of charge-accepting materials (p-type dopant) were formed into sides of 40 mm×20 mm and a thickness of 100 µm by a doctor blade method on the both end surfaces of the graphite sheet where were positions predetermined as the thermoelectric conversion material layer 3P as shown in FIG. 1, then they were heated and dried at 130° C. for 20 minutes. $Cu_2O$ was formed into sides of 40 mm×20 mm and a thickness of 0.3 µm on the top of the carbon nanotubes layers by a screen printing method, then they were annealed at 150° C. for 10 minutes under $N_2$ atmosphere. In this manner, p-type thermoelectric conversion material layers 3P which were composed of a lamination of the carbon nanotube layer and the $Cu_2O$ layer were formed.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(7-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 µm or, sides of 82 mm×20 mm and a thickness of 20 µm were fixed by soldering onto the Ag layers, and the electrodes 4 were formed.

The thermoelectric conversion element A(7) composed of an n-type thermoelectric conversion section 1N and a p-type thermoelectric conversion section 1P was produced as described above. (See FIG. 1.)

(7-4)

10 pieces of the thermoelectric conversion element A(7) produced as described above were connected in series to form a thermoelectric conversion element by using Al substrates having sides of 82 mm×20 mm and a thickness of 20 µm, and a laminate film was superposed on the top of the thermoelectric conversion element, then it was evacuated and heated at 200° C. and laminated to fabricate a module.

In the module composed of the thermoelectric conversion element A(7) produced as described above, the output of the module was examined under the condition of one electrode end at 50° C. and the other electrode end at 0° C. The output of 157 mW was obtained, as shown in Table 1.

Example 8

The thermoelectric conversion element A(8) shown in Embodiment 1 (FIG. 1) was produced as described in (8-1) to (8-4) below.

(8-1)

A silicon resin sheet was provided by sides of 84 mm×102 mm and a thickness of 1 mm as the insulating substrate 10. A PGS graphite sheet doped with trimethoxyphenylphosphine (MeO-TPP) of charge-donating materials (n-type dopant) was provided by sides of 40 mm×100 mm and a thickness of 100 µm as the charge transport layer 2N. The graphite sheet was disposed on the silicon resin sheet at the position of 1 mm inside from the edge of the silicon resin sheet. A heat-resistant adhesive was used to adhere.

Carbon nanotubes doped with trimethoxyphenylphosphine (MeO-TPP) of charge-donating materials (n-type dopant) were formed into sides of 40 mm×20 mm and a thickness of 100 µm by a doctor blade method on the both end surfaces of the graphite sheet where were positions predetermined as the thermoelectric conversion material layer 3N as shown in FIG. 1, then they were heated and dried at 130° C. for 20 minutes. ZnO was formed into sides of 40 mm×20 mm and a thickness of 0.3 µm on the top of the carbon nanotubes layers by a screen printing method, then they were annealed at 150° C. for 10 minutes under $N_2$ atmosphere. In this manner, n-type thermoelectric conversion material layers 3N which were composed of a lamination of the carbon nanotube layer and the $Fe_2O_3$ layer were formed.

By processes described above, the n-type thermoelectric conversion section 1N has the three layer structure composed of the insulating substrate 10 and the charge transport layer 2N and the thermoelectric conversion material layer 3N formed on the both end surfaces of the charge transport layer 2N.

(8-2)

Next, a PGS graphite sheet doped with carbazole of charge-accepting materials (p-type dopant) was provided by sides of 40 mm×100 mm and a thickness of 100 µm as the charge transport layer 2P. The graphite sheet was disposed on the silicon resin sheet at the position of 1 mm inside from the edge of the silicon resin sheet and 2 mm apart from the end of the charge transport layer 2N. A heat-resistant adhesive was used to adhere.

Carbon nanotubes doped with carbazole of charge-accepting materials (p-type dopant) were formed into sides of 40 mm×20 mm and a thickness of 100 µm by a doctor blade method on the both end surfaces of the graphite sheet where were positions predetermined as the thermoelectric conversion material layer 3P as shown in FIG. 1, then they were heated and dried at 130° C. for 20 minutes. $Cu_2O$ was formed into sides of 40 mm×20 mm and a thickness of 0.3 µm on the top of the carbon nanotubes layers by a screen printing method, then they were annealed at 150° C. for 10 minutes under $N_2$ atmosphere. In this manner, p-type thermoelectric conversion material layers 3P which were composed of a lamination of the carbon nanotube layer and the $Cu_2O$ layer were formed.

By processes described above, the p-type thermoelectric conversion section 1P has the three layer structure composed of the insulating substrate 10 and the charge transport layer 2P and the thermoelectric conversion material layer 3P formed on the both end surfaces of the charge transport layer 2P.

(8-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 µm or, sides of 82 mm×20 mm and a thickness of 20 µm were fixed by soldering onto the Ag layers, and the electrodes 4 were formed.

The thermoelectric conversion element A(8) composed of an n-type thermoelectric conversion section 1N and a p-type thermoelectric conversion section 1P was produced as described above. (See FIG. 1.)

(8-4)

10 pieces of the thermoelectric conversion element A(8) produced as described above were connected in series to form a thermoelectric conversion element by using Al substrates having sides of 82 mm×20 mm and a thickness of 20 µm, and a laminate film was superposed on the top of the thermoelectric conversion element, then it was evacuated and heated at 200° C. and laminated to fabricate a module.

In the module composed of the thermoelectric conversion element A(8) produced as described above, the output of the module was examined under the condition of one electrode end at 50° C. and the other electrode end at 0° C. The output of 224 mW was obtained, as shown in Table 1.

The examples described below were produced as follows.

Comparative Example 1

The thermoelectric conversion element B(1) shown in Comparative Embodiment 1 (FIG. 2) was produced as described in (Comparison 1-1) to (Comparison 1-4) below.
(Comparison 1-1)

A silicon resin sheet was provided by sides of 84 mm×102 mm and a thickness of 1 mm as the insulating substrate 10. Carbon nanotubes doped with triphenylphosphine (TPP) of charge-donating materials (n-type dopant) were formed into sides of 40 mm×100 mm and a thickness of 300 μm by a doctor blade method on the silicon resin sheet at the position of 1 mm inside from the edge of the silicon resin sheet, then they were heated and dried at 130° C. for 20 minutes.

By processes described above, the n-type thermoelectric conversion section 1N has the two layer structure composed of the insulating substrate 10 and the thermoelectric conversion material layer 3N.
(Comparison 1-2)

Next, carbon nanotubes doped with tetracyanoquinodimethane (TCNQ) of charge-accepting materials (p-type dopant) were formed into sides of 40 mm×100 mm and a thickness of 300 μm by a doctor blade method on the silicon resin sheet at the position of 1 mm inside from the edge of the silicon resin sheet and 2 mm apart from the end of the thermoelectric conversion material layer 3N, then they were heated and dried at 130° C. for 20 minutes.

By processes described above, the p-type thermoelectric conversion section 1P has the two layer structure composed of the insulating substrate 10 and the thermoelectric conversion material layer 3P.
(Comparison 1-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element B(1) composed of an n-type thermoelectric conversion section 1N and a p-type thermoelectric conversion section 1P was produced as described above. (See FIG. 2.)
(Comparison 1-4)

10 pieces of the thermoelectric conversion element B(1) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element B(1) produced as described above, the output of the module was examined under the condition of one electrode end at 50° C. and the other electrode end at 0° C. It was only obtained output of 0.013 mW in comparison to the output of 1.80 mW of Example 1, as shown in Table 1.

Comparative Example 2

The thermoelectric conversion element B(2) shown in Comparative Embodiment 1 (FIG. 2) was produced as described in (Comparison 2-1) to (Comparison 2-4) below.
(Comparison 2-1)

A silicon resin sheet was provided by sides of 84 mm×102 mm and a thickness of 1 mm as the insulating substrate 10. Carbon nanotubes doped with trimethoxyphenylphosphine (MeO-TPP) of charge-donating materials (n-type dopant) were formed into sides of 40 mm×100 mm and a thickness of 300 μm by a doctor blade method on the silicon resin sheet at the position of 1 mm inside from the edge of the silicon resin sheet, then they were heated and dried at 130° C. for 20 minutes.

By processes described above, the n-type thermoelectric conversion section 1N has the two layer structure composed of the insulating substrate 10 and the thermoelectric conversion material layer 3N.
(Comparison 2-2)

Next, carbon nanotubes doped with carbazole of charge-accepting materials (p-type dopant) were formed into sides of 40 mm×100 mm and a thickness of 300 μm by a doctor blade method on the silicon resin sheet at the position of 1 mm inside from the edge of the silicon resin sheet and 2 mm apart from the end of the thermoelectric conversion material layer 3N, then they were heated and dried at 130° C. for 20 minutes.

By processes described above, the p-type thermoelectric conversion section 1P has the two layer structure composed of the insulating substrate 10 and the thermoelectric conversion material layer 3P.
(Comparison 2-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element B(2) composed of an n-type thermoelectric conversion section 1N and a p-type thermoelectric conversion section 1P was produced as described above. (See FIG. 2.)
(Comparison 2-4)

10 pieces of the thermoelectric conversion element B(2) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element B(2) produced as described above, the output of the module was examined under the condition of one electrode end at 50° C. and the other electrode end at 0° C. It was only obtained output of 0.0015 mW in comparison to the output of 2.24 mW of Example 2, as shown in Table 1.

Comparative Example 3

The thermoelectric conversion element B(3) shown in Comparative Embodiment 1 (FIG. 2) was produced as described in (Comparison 3-1) to (Comparison 3-4) below.

(Comparison 3-1)

A silicon resin sheet was provided by sides of 84 mm×102 mm and a thickness of 1 mm as the insulating substrate 10. As an n-type thermoelectric conversion material, $Bi_2Te_{2.7}Se_{0.3}$ was formed into sides of 40 mm×100 mm and a thickness of 300 μm by a screen printing method on the silicon resin sheet at the position of 1 mm inside from the edge of the silicon resin sheet, then they were heated at 150° C. for 10 minutes under $N_2$ atmosphere.

By processes described above, the n-type thermoelectric conversion section 1N has the two layer structure composed of the insulating substrate 10 and the thermoelectric conversion material layer 3N.

(Comparison 3-2)

Next, as a p-type thermoelectric conversion material, $Bi_{0.5}Sb_{1.5}Te_3$ was formed into sides of 40 mm×100 mm and a thickness of 300 μm by a screen printing method on the silicon resin sheet at the position of 1 mm inside from the edge of the silicon resin sheet and 2 mm apart from the end of the thermoelectric conversion material layer 3N, then they were heated at 150° C. for 10 minutes under $N_2$ atmosphere.

By processes described above, the p-type thermoelectric conversion section 1P has the two layer structure composed of the insulating substrate 10 and the thermoelectric conversion material layer 3P.

(Comparison 3-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element B(3) composed of an n-type thermoelectric conversion section 1N and a p-type thermoelectric conversion section 1P was produced as described above. (See FIG. 2.)

(Comparison 3-4)

10 pieces of the thermoelectric conversion element B(3) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element B(3) produced as described above, the output of the module was examined under the condition of one electrode end at 50° C. and the other electrode end at 0° C. It was only obtained output of 1.26 mW in comparison to the output of 15.7 mW of Example 3 or the output of 25.3 mW of Example 6, as shown in Table 1.

Comparative Example 4

The thermoelectric conversion element B(4) shown in Comparative Embodiment 1 (FIG. 2) was produced as described in (Comparison 4-1) to (Comparison 4-4) below.

(Comparison 4-1)

A silicon resin sheet was provided by sides of 84 mm×102 mm and a thickness of 1 mm as the insulating substrate 10. As an n-type thermoelectric conversion material, $Fe_2O_3$ was formed into sides of 40 mm×100 mm and a thickness of 1 μm by an ion plating method on the silicon resin sheet at the position of 1 mm inside from the edge of the silicon resin sheet, then they were annealed at 150° C. for 10 minutes under $N_2$ atmosphere.

By processes described above, the n-type thermoelectric conversion section 1N has the two layer structure composed of the insulating substrate 10 and the thermoelectric conversion material layer 3N.

(Comparison 4-2)

Next, as a p-type thermoelectric conversion material, $Cu_2O$ was formed into sides of 40 mm×100 mm and a thickness of 1 μm by an ion plating method on the silicon resin sheet at the position of 1 mm inside from the edge of the silicon resin sheet and 2 mm apart from the end of the thermoelectric conversion material layer 3N, then they were annealed at 150° C. for 10 minutes under $N_2$ atmosphere.

By processes described above, the p-type thermoelectric conversion section 1P has the two layer structure composed of the insulating substrate 10 and the thermoelectric conversion material layer 3P.

(Comparison 4-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element B(4) composed of an n-type thermoelectric conversion section 1N and a p-type thermoelectric conversion section 1P was produced as described above. (See FIG. 2.)

(Comparison 4-4)

10 pieces of the thermoelectric conversion element B(4) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element B(4) produced as described above, the output of the module was examined under the condition of one electrode end at 50° C. and the other electrode end at 0° C. It was only obtained output of 0.00093 mW in comparison to the output of 142 mW of Example 4 or the output of 157 mW of Example 7 as shown in Table 1.

Comparative Example 5

The thermoelectric conversion element B(5) shown in Comparative Embodiment 1 (FIG. 2) was produced as described in (Comparison 5-1) to (Comparison 5-4) below.

(Comparison 5-1)

A silicon resin sheet was provided by sides of 84 mm×102 mm and a thickness of 1 mm as the insulating substrate 10. As an n-type thermoelectric conversion material, ZnO was formed into sides of 40 mm×100 mm and a thickness of 1 μm by an ion plating method on the silicon resin sheet at the position of 1 mm inside from the edge of the silicon resin sheet, then they were annealed at 150° C. for 10 minutes under $N_2$ atmosphere.

By processes described above, the n-type thermoelectric conversion section 1N has the two layer structure composed of the insulating substrate 10 and the thermoelectric conversion material layer 3N.

(Comparison 5-2)

Next, as a p-type thermoelectric conversion material, $Cu_2O$ was formed into sides of 40 mm×100 mm and a thickness of 1 μm by an ion plating method on the silicon resin sheet at the position of 1 mm inside from the edge of the silicon resin sheet and 2 mm apart from the end of the thermoelectric conversion material layer 3N, then they were annealed at 150° C. for 10 minutes under $N_2$ atmosphere.

By processes described above, the p-type thermoelectric conversion section 1P has the two layer structure composed of the insulating substrate 10 and the thermoelectric conversion material layer 3P.

(Comparison 5-3)

Ag layers were formed into sides of 40 mm×20 mm by Ag vapor deposition on the both end surfaces of the n-type thermoelectric conversion material layer 3N and the p-type thermoelectric conversion material layer 3P. Al substrates having sides of 40 mm×20 mm and a thickness of 20 μm or, sides of 82 mm×20 mm and a thickness of 20 μm were fixed by soldering onto the Ag layers, and the electrodes 4 were formed.

The thermoelectric conversion element B(5) composed of an n-type thermoelectric conversion section 1N and a p-type thermoelectric conversion section 1P was produced as described above. (See FIG. 2.)

(Comparison 5-4)

10 pieces of the thermoelectric conversion element B(5) produced as described above were connected in series to form a thermoelectric conversion element by using Al substrates having sides of 82 mm×20 mm and a thickness of 20 μm, and a laminate film was superposed on the top of the thermoelectric conversion element, then it was evacuated and heated at 200° C. and laminated to fabricate a module.

In the module composed of the thermoelectric conversion element B(5) produced as described above, the output of the module was examined under the condition of one electrode end at 50° C. and the other electrode end at 0° C. It was only obtained output of 0.00061 mW in comparison to the output of 207 mW of Example 4 or the output of 224 mW of Example 8 as shown in Table 1.

Embodiment 2

Next, the thermoelectric conversion module according to the Embodiment 2 is described based on FIG. 5.

FIG. 5 is an explanatory diagram for showing an example of production processes of a thermoelectric conversion module according to Embodiment 2 of the present invention. FIG. 5(1) shows the first layer (process 1) of the thermoelectric conversion module, FIG. 5(2) shows the second layer (process 2) of the thermoelectric conversion module, FIG. 5(3) shows the third layer (process 3) of the thermoelectric conversion module. FIG. 5(4) shows the forth layer (process 4) of the thermoelectric conversion module.

(Process 1)

Two ceramic substrates 5 having sides of 310 mm×51 mm and a thickness of 1 mm were provided, and a resin substrate 6 made of phenol resin having sides of 310 mm×50 mm and a thickness of 1 mm was provided.

As shown in the first layer (process 1) of FIG. 5(1), it was arranged so that the resin substrate 6 is sandwiched between the two ceramic substrates 5, and it was bonded by a heat-resistant adhesive. In this manner, a composite substrate having sides of 310 mm×152 mm and a thickness of 1 mm was fabricated with the two ceramic substrates 5 and the resin substrate 6. This was used as the insulating substrate 10.

Here, when assuming that the longitudinal direction of the insulating substrate 10 is the X-direction and the transverse direction of that is the Y-direction, then the insulating substrate 10 is placed so that the ceramic substrate 5, the resin substrate 6 and the ceramic substrate 5 are arranged in this order in the Y direction.

(Process 2)

As the charge transport layer 2N, three PGS graphite sheets (2N) doped with triphenylphosphine (TPP) of charge-donating materials (n-type dopant) were provided by sides of 50 mm×150 mm and a thickness of 100 μm. Next, as the charge transport layer 2P, three PGS graphite sheets (2P) doped with tetracyanoquinodimethane (TCNQ) of charge-accepting materials (p-type dopant) was provided by sides of 50 mm×150 mm and a thickness of 100 μm.

As shown in the second layer (process 2) of FIG. 5(2), graphite sheets (2N, 2P) as charge transport layers were disposed alternately at the positions of the charge transport layers 2N and 2P on the insulating substrate 10 so that their doping surfaces faced up respectively. A heat-resistant adhesive was used to adhere.

Each graphite sheet (2N, 2P) was disposed so that its longitudinal direction was along the Y-direction. As a result, both ends of each graphite sheet (2N, 2P) were disposed so as to be in contact with the ceramic substrate 5 at both ends of the insulating substrate 10.

In addition, a plurality of graphite sheets (2N, 2P) (three pieces respectively in FIG. 5) were disposed so that the N-type graphite sheets and the P-type graphite sheets were alternately disposed in the X-direction.

(Process 3)

As shown in the third layer (process 3) of FIG. 5(3), the thermoelectric conversion material layers 3N and 3P having sides of 50 mm×50 mm and a thickness of 100 μm were formed on the both end surfaces of the graphite sheets (2N, 2P) of the second layer respectively. Each of the thermoelectric conversion material layers 3N and 3P was formed by a screen printing method using paste of $Bi_2Te_{2.7}Se_{0.3}$ as n-type thermoelectric conversion materials and paste of $Bi_{0.5}Sb_{1.5}Te_3$ as p-type thermoelectric conversion materials, then they were heated at 150° C. for 10 minutes under $N_2$ atmosphere.

(Process 4)

As shown in the fourth layer (process 4) of FIG. 5(4), the passivation films 8 were formed by applying polytetrafluoroethylene on the portions exposed the doped layer on the central surfaces of the graphite sheets (2N) and by baking at 350° C., and also the passivation films 8 were formed by forming the silicon nitride films by a plasma CVD method on the portions exposed the doped layer on the central surfaces of the graphite sheets (2P). Next, Ag layers were formed into sides of 50 mm×50 mm by Ag vapor deposition on top surfaces of the thermoelectric conversion material layers 3N and 3P, and Al substrates having sides of 50 mm×50 mm and a thickness of 50 μm or, sides of 101 mm×50 mm and a thickness of 50 μm were fixed by soldering onto the Ag layers, thus the electrodes 4 were formed.

Electrodes 4 were arranged by bonding adjacent Ag layers with each other so that a route of electric charges flowing through the graphite layers (2N, 2P) in the second layer made a meander shape.

Further, electrical connection terminals 7 were fixed to the side surfaces of the electrodes 4 at both ends of the meander shape mentioned above. The electrical connection terminal 7 is a terminal made of copper wire and has a structure in which the surface is covered with insulator.

As mentioned above, three sets of the thermoelectric conversion elements constituted of an n-type thermoelectric conversion section and a p-type thermoelectric conversion section were disposed in series connection on the insulating substrate 10, thus a thermoelectric conversion module was constituted.

Thus, it has been possible to realize a thermoelectric conversion module having charge transport layers by arranging the three sets of the thermoelectric conversion elements constituted of an n-type thermoelectric conversion section and a p-type thermoelectric conversion section in series.

Embodiment 3

Next, the thermoelectric conversion module according to the Embodiment 3 is described based on FIG. 6.

FIG. 6 is a schematic diagram of a thermoelectric conversion module according to Embodiment 3 of the present invention. FIG. 6(1) shows a perspective view of the thermoelectric conversion module. FIG. 6(2) shows a sectional view taken along line E-E of the thermoelectric conversion module in FIG. 6(1).

As shown in FIG. 6(1), (2), the thermoelectric conversion module according to Embodiment 3 of the present invention has a structure that the thermoelectric conversion modules in FIG. 5 were superposed in three stages along the thickness direction (Z-direction).

Specifically, as shown in FIG. 6(2), the bottom surface of the ceramic substrate 5 of the thermoelectric conversion module MB was contacted with the upper surface of the electrode 4 of the thermoelectric conversion module MA, and the bottom surface of the ceramic substrate 5 of the thermoelectric conversion module MC was contacted with the upper surface of the electrode 4 of the thermoelectric conversion module MB, and these three thermoelectric conversion modules were arranged by being bonded with a heat-resistant adhesive.

Subsequently, the insulating substrate 10 having sides of 310 mm×152 mm and a thickness of 1 mm was disposed at the uppermost part of the thermoelectric conversion module stacked in three stages.

Then, in the thermoelectric conversion module, the arrangement of the n-type thermoelectric conversion section and the p-type thermoelectric conversion section of the top-stage and the bottom-stage were alternated the arrangement of those of the middle-stage each other. Subsequently, the electric connection terminals 7 of each thermoelectric conversion module stacked in the thickness direction (Z-direction) were connected in series so as to form a meander shape from the bottom-stage to the top-stage. Next, the phenol resin substrates were adhered to the four side portions of the stacked thermoelectric conversion module with a heat resistant adhesive.

Finally, the laminate films were placed in joint portions of the four sides, and were evacuated and heated at 200° C., thus it was laminated and sealed. Surplus laminate films which cover the top surface and the bottom surface of the ceramic substrates in the module were removed, and the ceramic substrate surfaces were exposed.

By laminating the thermoelectric conversion modules in three layers in this way, it has been possible to realize a thermoelectric conversion module having charge transport layers and having excellent thermoelectric conversion performances.

FIG. 7 is an explanatory view for showing a connection example between a thermoelectric conversion module and an output measuring device according to Embodiment 2 or 3 of the present invention.

As shown in FIG. 7, by using insulating substrates of the present invention, one end portion of the laminated thermoelectric conversion module functions effectively as a heating/high-temperature section, and the other end portion of the laminated thermoelectric conversion module functions effectively as a cooling/low-temperature section. Therefore, excellent thermoelectric conversion performances can be realized.

In addition, in the Embodiment 2, although the structure of the thermoelectric conversion module which used three sets of thermoelectric conversion elements has been described, it is of course not limited to three sets.

Further, in the Embodiment 3, although the thermoelectric conversion module arranged in three stages of thermoelectric conversion modules in series connection has been described, it is of course not limited to three, and it may include parallel connections.

DESCRIPTION OF REFERENCE NUMERALS

Thermoelectric conversion element A: Thermoelectric conversion element according to Embodiment 1 of the present invention Thermoelectric conversion element B: Thermoelectric conversion element according to Comparative Embodiment 1

1N: N-type thermoelectric conversion section
1P: P-type thermoelectric conversion section
2N: N-type charge transport layer
2P: P-type charge transport layer
3N: N-type thermoelectric conversion material layer
3P: P-type thermoelectric conversion material layer
4: Electrode
5: Ceramic substrate
6: Resin substrate
7: Electrical connection terminal
8: Passivation film
10: Insulating substrate
MA, MB, MC: Thermoelectric conversion module
100: Conventional thermoelectric conversion element
120, 121, 180: Electrode

What is claimed is:

1. A thermoelectric conversion element comprising an n-type thermoelectric conversion element and a p-type thermoelectric conversion element,
  wherein the n-type thermoelectric conversion element comprises at least an n-type charge transport layer and two n-type thermoelectric conversion material layers and two electrodes,
  wherein the n-type charge transport layer comprises a surface of a graphite doped with charge-donating material so that the surface has an n-type semiconductor property and so that the thermal conductivity in the in-plane direction of the doped surface of the graphite is reduced by doping the charge-donating material,
  wherein the two n-type thermoelectric conversion material layers are formed apart from each other on the same side of the doped graphite surface of the n-type charge transport layer, and the two electrodes are formed on the upper part of the two n-type thermoelectric conversion material layers, respectively, wherein the p-type thermoelectric conversion element comprises at least a p-type charge transport layer and two p-type thermoelectric conversion material layers and two electrodes, wherein the p-type charge transport layer comprises a surface of a graphite doped with charge-accepting material so that the surface has a p-type semiconductor property and so that the thermal conductivity in the in-plane direction of the doped surface of the graphite is reduced by doping the charge-accepting material, wherein the two p-type thermoelectric conversion material layers are formed apart from each other on the same side of the doped graphite surface of the p-type charge transport layer, and the two electrodes are formed on the upper part of the two p-type thermoelectric conversion material layers, respectively, and wherein the thermoelectric conversion element is formed by connecting one of the electrodes of the n-type thermoelectric conversion element and one of the electrodes of the p-type thermoelectric conversion element.

2. The thermoelectric conversion element according to claim 1, wherein the charge-donating material is at least one of the group consisting of tetrathiafulvalene (TTF), tetramethyl-tetrathiafulvalene (TMTTF), bis-ethylenedithio-tetrathiafulvalene (BEDT-TTF), tetraselenafulvalene (TSF), triphenylphosphine (TPP), trimethoxyphenylphosphine (MeO-TPP), trifluoride-triphenylphosphine (F-TPP), diphenylphosphine (DPP), bis-diphenylphosphino-ethane (DPPE), bis-diphenylphosphino-propane (DPPP), amines, polyamines, polyethyleneimine, sodium-carbonate, lithium-carbonate, potassium-carbonate, Cu-phthalocyanine, Zn-phthalocyanine and derivatives thereof.

3. The thermoelectric conversion element according to claim 1, wherein the charge-accepting material is at least one of the group consisting of tetracyanoquinodimethane (TCNQ), tetrafluoro-tetracyanoquinodimethane (TCNQF4), dicyclopentyldimethoxysilane-dicyanobenzoquinone (DDQ), trinitrofluorenone (TNF), dinitro-fluorenone (DNF), carbazole, 9H-carbazole-4ol, 2-hydroxy-9H-carbazole, phenyl-boronic-acid, pyridine, quinoline, imidazole, triphenylamine, and derivatives thereof.

4. The thermoelectric conversion element according to claim 1, wherein the n-type thermoelectric conversion material layers and the p-type thermoelectric conversion material layers are at least one of the group consisting of carbon nanotubes, Bi—Te based compounds, oxides, and combinations thereof.

5. The thermoelectric conversion element according to claim 1, wherein the thermoelectric conversion element further comprises an insulating substrate, wherein, the insulating substrate is a composite substrate formed by joining two pieces of a second substrate one by one to both ends of a first substrate, and wherein the second substrate is made of insulating material having higher thermal conductivity than that of the first substrate.

6. The thermoelectric conversion element according to claim 1, wherein a passivation film is formed on a central part of the n-type charge transport layer and the p-type charge transport layer, respectively, where the n-type thermoelectric conversion material layers and the p-type thermoelectric conversion material layers are not formed.

* * * * *